US008016942B2

(12) United States Patent
Nawata et al.

(10) Patent No.: US 8,016,942 B2
(45) Date of Patent: Sep. 13, 2011

(54) PROCESS FOR PRODUCING METAL FLUORIDE SINGLE CRYSTAL

(75) Inventors: Teruhiko Nawata, Shunan (JP); Ken Yasumura, Shunan (JP); Hiroyuki Yanagi, Shunan (JP); Eiichi Nishijima, Shunan (JP)

(73) Assignee: Tokuyama Corporation (JP)

( * ) Notice: Subject to any disclaimer, the term of this patent is extended or adjusted under 35 U.S.C. 154(b) by 1046 days.

(21) Appl. No.: 11/793,572

(22) PCT Filed: Dec. 16, 2005

(86) PCT No.: PCT/JP2005/023182
§ 371 (c)(1),
(2), (4) Date: Jun. 20, 2007

(87) PCT Pub. No.: WO2006/068062
PCT Pub. Date: Jun. 29, 2006

(65) Prior Publication Data
US 2008/0000413 A1    Jan. 3, 2008

(30) Foreign Application Priority Data

Dec. 22, 2004 (JP) .................................. 2004-370658
Sep. 14, 2005 (JP) .................................. 2005-267398

(51) Int. Cl.
*C30B 15/02* (2006.01)
(52) U.S. Cl. ................ 117/30; 117/11; 117/13; 117/18; 117/19; 117/31; 117/33; 117/940
(58) Field of Classification Search ............ 117/11, 117/13, 18, 19, 30, 31, 33, 940
See application file for complete search history.

(56) References Cited

U.S. PATENT DOCUMENTS

| 4,609,425 A * | 9/1986 | Mateika et al. ................. 117/31 |
| 4,750,969 A | 6/1988 | Sassa et al. |
| 4,938,837 A | 7/1990 | Tada et al. |
| 5,429,067 A | 7/1995 | Tatsumi et al. |
| 5,879,449 A * | 3/1999 | Beswick ........................ 117/30 |
| 2003/0089299 A1 | 5/2003 | Obara et al. |
| 2004/0107893 A1* | 6/2004 | Nawata et al. ................. 117/13 |

FOREIGN PATENT DOCUMENTS

JP            61261288 A      11/1986

(Continued)

OTHER PUBLICATIONS

Zaslavsky, B.G., "Automated pulling of large-diameter alkali halide scintillation single crystals from the melt", Journal of Crystal Growth, Apr. 1, 1999, pp. 476-482, vol. 200, No. 3-4, Elsevier, Amsterdam, NL.

*Primary Examiner* — Matthew Song
(74) *Attorney, Agent, or Firm* — The Webb Law Firm

(57) ABSTRACT

A metal fluoride single crystal pulling apparatus that upward pulling initiation through termination, in the state of shallow melt capable of highly effective inhibition of scatterer formation, can perform stable growth of single crystal and can suppress any mixing of air bubbles and occurrence of crystal break during crystal growth, etc; and a process for producing a metal fluoride single crystal therewith. As a crucible for accommodating a melt of raw metal fluoride, use is made of a double structured crucible composed of an outer crucible and an inner crucible. In the upward pulling of single crystal, the accommodation depth of inner crucible relative to the outer crucible is increased in accordance with any decrease of melt accommodated in the inner crucible according to the growth of single crystal, so that the melt accommodated in the outer crucible is fed into the inner crucible to thereby maintain the amount of melt accommodated in the inner crucible within a given range. Further, at the position of an opening that upward opens any gap space between an external surface of outer crucible and an internal surface of inner crucible, or an interstice, situated below the opening, between a side wall internal surface of outer crucible and a side wall external surface of inner crucible, there is disposed a cutoff member that cuts off at least part of the position.

6 Claims, 3 Drawing Sheets

FOREIGN PATENT DOCUMENTS

| | | |
|---|---|---|
| JP | 62087489 A | 4/1987 |
| JP | 63195188 A | 8/1988 |
| JP | 63282187 A | 11/1988 |
| JP | 63295498 A | 12/1988 |
| JP | 1294592 A | 11/1989 |
| JP | 1305883 A | 12/1989 |
| JP | 2004182587 A | 7/2004 |
| JP | 2004231502 A | 8/2004 |
| JP | 2006117494 A | 5/2006 |
| WO | 02077676 A1 | 10/2002 |

* cited by examiner $L_1$ : Inside diameter of inner crucible
$L_2$ : Diameter of bottom wall portion

PROCESS FOR PRODUCING METAL FLUORIDE SINGLE CRYSTAL

TECHNICAL FIELD

The present invention relates to a pulling apparatus to be used for producing a metal fluoride single crystal to be utilized for an optical material or the like, and a process for producing a metal fluoride single crystal using the apparatus.

BACKGROUND ART

Since a single crystal of metal fluoride such as calcium fluoride or barium fluoride has a high transmittance over a waveband within a wide range, and has a low dispersion and is also excellent in a chemical stability, it has been demanded greatly as an optical material such as lenses and window materials of various apparatuses using a laser emitting an ultraviolet ray or a vacuum ultraviolet ray, a camera, a CVD device and the like. In particular, the calcium fluoride single crystal has been expected as a window material of a light source, a light source system lens and a projection system lens in an ArF laser (193 nm) or an $F_2$ laser (157 nm) which has been developed as a next generation short wavelength light source in an optical lithographic technique.

Conventionally, the metal fluoride single crystal is generally produced by a crucible depression method (the Bridgman's method) or a single crystal pulling method (the Czochralski method). The crucible depression method implies a method of gradually bringing down a melting solution of single crystal producing material in a crucible together with the crucible and cooling them, thereby growing a single crystal in the crucible. On the other hand, the single crystal pulling method implies a method of causing a seed crystal formed by a single crystal to be a target to come in contact with a surface of a melting solution of the single crystal producing material in the crucible, and subsequently, gradually pulling the seed crystal upward from a heating area of the crucible and carrying out cooling, thereby growing the single crystal below the seed crystal.

There has been a problem in that an as-grown single crystal of metal fluoride produced by the crucible depression method or the single crystal pulling method has a large number of internal defects found as shiny grains scattering a light, that is, so-called scattering bodies, through an observation under a light concentrating illumination. For example, it has been reported that a part of a lower portion of the single crystal having a small number of scattering bodies is to be selected and cut out of the whole as-grown single crystal in order to obtain an optical member having at least 160 scattering bodies in a maximum diameter of 20 μm or less per $cm^3$ in case of the metal fluoride single crystal obtained by the crucible depression method (see Patent Document 1). Moreover, most of the scattering bodies are holes in actual situations as will be described below. In a material melting solution accommodated in the crucible, therefore, they are easily formed in a process for crystallizing an upper liquid in place of a lower liquid. In the case in which the single crystal is produced by the single crystal pulling method, they tend to be formed much more easily than in the crucible depression method.

In addition, in both of the methods, the scattering bodies are generated more remarkably in the case in which a single crystal having a large diameter is produced in place of a single crystal having a small diameter.

When a large number of scattering bodies are present in the single crystal, there is a possibility that a transmittance might be reduced by the scatter of a light, a contrast might be lowered or a flare or a ghost might be generated in the case in which the single crystal is processed into an optical material. Accordingly, it is necessary to decrease the scattering bodies in the single crystal as greatly as possible. In the crucible depression method and the single crystal pulling method, however, there has not been known a method of effectively suppressing the formation of the scattering bodies in a straight barrel portion to be the most useful place in the cut-out of the optical material or over the whole as-grown single crystal. Under the existing circumstances, there is only means for selecting and cutting out a slight portion having a small amount of the formation. Accordingly, it is hard to cut out the optical material having a large diameter. Referring to the optical material having a small diameter, moreover, most of the as-grown single crystal other than the cut portion is to be a defective product. Thus, a yield of a product is considerably low.

In such a background, the present inventors found that it is possible to greatly suppress the formation of the scattering bodies by setting a depth of a raw metal fluoride melting solution to be equal to or less than 0.65 times as great as a diameter of the straight barrel portion of the single crystal even in the single crystal pulling method in which the scattering bodies should be generally formed more greatly, and previously filed the patent application (Japanese Patent Application No. 2004-309430). According to this method, it is possible to greatly reduce a natural convection of the melting solution in the crucible which causes the formation of the scattering bodies. As a result, it is possible to efficiently produce the as-grown single crystal of the metal fluoride which has a small amount of presence of the scattering bodies and a large diameter.

In the case in which this method is to be executed by using an existing pulling apparatus which is known for producing the metal fluoride single crystal, however, it is necessary to deeply accommodate the melting solution by all means in the beginning of the start of pulling even if the raw metal fluoride is accommodated as slightly as possible in a crucible having a deep bottom and a large diameter in order to execute the pulling. Therefore, the effects cannot be exhibited sufficiently.

In the case in which the single crystal to be pulled has a large diameter and a straight barrel portion has a great length, particularly, there is a possibility that the melting solution might be accommodated more deeply than the specified value in the beginning of the start of the pulling. In this case, the growth of the single crystal in a state in which the melting solution is shallow can be achieved only in such a condition that the pulling is considerably advanced. In an as-grown single crystal thus obtained, a considerable number of scattering bodies are formed in an upper part such as a shoulder portion.

As a method of maintaining a certain depth of the melting solution from the beginning of the start of the pulling of the metal fluoride single crystal to the completion of the pulling, there has been known a method of supplementing a material corresponding to the melting solution decreased by the pulling of the single crystal into the crucible. However, a reactivity of the metal fluoride to oxygen or water at a high temperature is very high. For this reason, it is necessary to carry out a careful purity increasing treatment such as a high temperature dehydrating treatment or a fluorinating treatment for the raw material to be supplemented. In respect of the structure of the apparatus, it is very hard to supplement the raw material in a state in which a high purity is thus maintained.

For the apparatus for pulling a single crystal, it has been known that a crucible having a double structure constituted by an inner crucible and an outer crucible is used to enhance a uniformity of an impurity concentration for producing a semiconductor single crystal such as silicon doped with an impurity (Patent Document 2 and Patent Document 3). However, the pulling apparatus comprising the double structured crucible which has been described in these documents is used for a single crystal growth of a semiconductor material, and there is no motive of use in the production of a metal fluoride single crystal in which an impurity is not doped. Actually, an example in which the apparatus is used has not been known at all.

Patent Document 1: International Laid-Open No. 02/077676 pamphlet

Patent Document 2: Japanese Patent Application No. Sho 61-261288

Patent Document 3: Japanese Patent Application No. Sho 62-87489

DISCLOSURE OF THE INVENTION

Problems to be Solved by the Invention

As described above, there is a great problem in that it is necessary to develop an apparatus for pulling a metal fluoride single crystal which can carry out pulling in a shallow state in which a raw metal fluoride melting solution has a depth within a certain range from the beginning of a start of the pulling to an end without an influence of a diameter of a single crystal to be produced, a length of a straight barrel portion and the like, and can exhibit the function of suppressing the formation of scattering bodies in an inner part of the single crystal at a maximum through the pulling in the state in which the melting solution is shallow.

In the production using the method of pulling a metal fluoride single crystal, furthermore, there has also been a problem in that a solid impurity is generated to float on the surface of a raw metal fluoride melting solution obtained by changing raw metal fluoride into a melting solution in many cases, and the pulling of the single crystal in such a state causes the solid impurity to be taken into the single crystal or the produced crystal to be partially polycrystallized with a start therefrom.

Accordingly, there has also been a great problem in that the structure is to be improved in order to easily remove the solid impurity floating on the surface of the raw metal fluoride melting solution in the crucible.

On the other hand, in the production using the method of pulling a metal fluoride single crystal, there is a problem in that it is hard to stably produce a large-sized single crystal. More specifically, in the case in which the single crystal is produced by the crystal pulling method, the single crystal is gradually pulled from the metal fluoride material melting solution. If the single crystal has a large diameter, however, a crystal growth is often stopped (cut) before a target length is obtained during the pulling.

Also in the case in which the crystal is cut, the single crystal corresponding to several cm from an interface is put into the melting solution and is thus dissolved again so that the crystal can be linked. However, the crystal growth is usually carried out at a speed of approximately 1 to 10 mm per hour. For this reason, a very great deal of time loss is made. In particular, for growth of a single crystal having a larger size a lower growth speed is necessary. For this reason, this problem is serious. In the case in which the crystal is thus linked, moreover, it cannot be always linked completely and a crystal disorder is often caused.

Even if the crystal is not cut, furthermore, bubbles enter the single crystal which is obtained in many cases. The bubbles are much larger holes than the scattering bodies. While the scattering bodies are a negative crystal in many cases and take a shape of a square polyhedron, the bubble is supposed to absorb an atmospheric gas or the like due to a disorder of a crystal growth interface during the crystal growth and takes a shape having a smooth contour which is less square in many cases.

It is possible to often observe the bubble with the naked eye under brightness on a level of a fluorescent lamp or the like without using a light concentrating illumination, and the bubble usually has a size of 100 µm to several cm. It is possible to find the crystal cut by monitoring a change in a weight or the like during the pulling of the crystal. In the case in which the bubbles enter the crystal, however, it is hard to find the entering of the bubbles during the pulling of the crystal. In many cases, the entering of the bubbles cannot be found before the crystal is taken out, which is a very great problem.

In some cases in which the metal fluoride single crystal is produced by the crystal pulling method, moreover, the melting solution is solidified stalagmitically on a bottom of the crucible or a wall of the crucible. In the case in which such a solidification at the bottom of a crucible becomes large-sized, it collides against the growing single crystal. For this reason, it is necessary to carry out a work for once stopping the pulling of the crystal to dissolve the solidification at the bottom of a crucible, which is also a great problem. In the same manner as the crystal cut, furthermore, the crystal cannot be always linked completely.

The generation of the crystal cut, the mixture of the bubbles and the generation of the solidification at the bottom of a crucible are particularly remarkable in the case in which the crystal is pulled under a reduced pressure.

It is an object of the present invention to provide an apparatus for pulling a metal fluoride single crystal and a process for producing a metal fluoride single crystal which can stably grow a single crystal in a shallow state of a melting solution in which the formation of a scattering bodies are suppressed highly from a start of the pulling to an end.

Moreover, it is an object of the present invention to provide an apparatus for pulling a metal fluoride single crystal and a process for producing a metal fluoride single crystal in which a solid impurity can be suppressed to be contained in an as-grown single crystal, and furthermore, a partial polycrystallization can be suppressed to be generated due to the solid impurity.

Furthermore, it is an object of the present invention to provide an apparatus for pulling a metal fluoride single crystal and a process for producing a metal fluoride single crystal in which the generation of a crystal cut, the mixture of bubbles or the generation of a solidification at the bottom of a crucible during a crystal growth can be suppressed and a large-sized single crystal of metal fluoride can be produced stably and efficiently.

In addition, it is an object of the present invention to provide an apparatus for pulling a metal fluoride single crystal and a process for producing a metal fluoride single crystal which can produce a single crystal having a high transmittance in the vacuum ultraviolet region.

The present inventors vigorously made investigations in consideration of the problems. As a result, they found that it is possible to solve the problems by setting a crucible provided in a pulling apparatus to have a specific double crucible structure, and completed the present invention.

Furthermore, they thought that the problems might be caused by the fact that metal fluoride to be fluoride having a high volatility is volatilized from a melting solution surface during a crystal growth at a high temperature, and further advances the investigations. As a result, they completed the present invention.

SUMMARY OF THE INVENTION

The present invention provides an apparatus for pulling a metal fluoride single crystal, wherein a double structured crucible constituted by an outer crucible and an inner crucible accommodated in the outer crucible is provided in a chamber forming a single crystal growth furnace, hollow portions of both the outer crucible and the inner crucible in the double structured crucible partially communicate with each other, the double structured crucible can continuously change an accommodating depth of the inner crucible with respect to the outer crucible, and a single crystal pulling bar having a tip to which a seed crystal is attached so as to be used and suspended to be vertically movable is provided just above the hollow portion of the inner crucible in the chamber.

In the invention described above, it is preferable that the inner crucible has a position fixed to the chamber, and the outer crucible can be continuously moved vertically in the chamber so that an accommodating depth of the inner crucible with respect to the outer crucible can be changed continuously.

The present invention provides a process for producing a metal fluoride single crystal using the pulling apparatus described above, comprising:

accommodating a raw metal fluoride melting solution in each of hollow portions of an outer crucible and an inner crucible in a double structured crucible;

moving a single crystal pulling bar downward until a seed crystal attached to a tip of the single crystal pulling bar comes in contact with a surface of the melting solution accommodated in the inner crucible and then pulling the single crystal pulling bar gradually to grow a metal fluoride single crystal;

increasing an accommodating depth of the inner crucible with respect to the outer crucible during the growth of the metal fluoride single crystal, according to a decrease of the melting solution accommodated in the inner crucible with the growth of the metal fluoride single crystal; and supplementing the melting solution accommodated in the outer crucible into the inner crucible in such a manner that an amount of the melting solution in the inner crucible is maintained within a certain range.

In the invention described above, it is preferable that the accommodating depth of the inner crucible with respect to the outer crucible is increased in such a manner that the amount of the melting solution in the inner crucible has a depth of 3 cm or more and is maintained within a range of at least 0.65 time as great as a diameter of a straight barrel portion of the single crystal during the pulling of the metal fluoride single crystal.

According to the invention described above, it is possible to grow the single crystal while maintaining the depth of the raw metal fluoride melting solution to be constant from a start of the pulling to an end. For example, even if the single crystal to be pulled has a large size, particularly, a super-large size in which the diameter of the straight barrel portion is equal to or greater than 150 mm and a length of the straight barrel portion is equal to or greater than 100 mm, it is possible to grow the single crystal while maintaining the depth of the raw metal fluoride melting solution to be constant.

Also in the case in which such a large-sized metal fluoride single crystal is produced, therefore, it is possible to stably pull the single crystal in a shallow state of the melting solution in which the formation of a scattering bodies are suppressed highly for a whole period of the pulling or a pulling period of the straight barrel portion. Thus, it is possible to easily produce an as-grown single crystal of the metal fluoride in which the amount of presence of the scattering bodies are considerably small.

In the pulling apparatus described above, the present invention provides an apparatus for pulling a metal fluoride single crystal, wherein a circular opening portion for upward opening a gap space formed by an external surface of the outer crucible and an internal surface of the inner crucible is provided between an internal surface of a sidewall of the outer crucible and an external surface of a sidewall of the inner crucible.

Furthermore, it is preferable that the inner crucible is provided with a communicating hole for causing hollow portions of both the outer crucible and the inner crucible to communicate with each other, wherein the communicating hole is formed on a lowermost end of the sidewall or a bottom wall when the bottom wall is horizontal, or below a position in which an inside diameter of the bottom wall is equal to or smaller than ¼ of an inside diameter of the inner crucible when the bottom wall takes a downward convex shape.

It is preferable that an interval between the internal surface of the sidewall of the outer crucible and the external surface of the sidewall of the inner crucible in the opening portion is 1/10 to 1/3 of an inside diameter of the outer crucible.

The present invention provides a process for producing a metal fluoride single crystal using the pulling apparatus described above, comprising:

accommodating a raw metal fluoride melting solution in each of hollow portions of an outer crucible and an inner crucible in a double structured crucible, and then, once reducing an accommodating depth of the inner crucible with respect to the outer crucible to cause the melting solution accommodated in the inner crucible to flow toward the outer crucible side;

thereafter increasing the accommodating depth of the inner crucible with respect to the outer crucible again to feed, into the inner crucible, the melting solution in the outer crucible; and carrying out the operation at least once and subsequently starting an operation for pulling a metal fluoride single crystal.

In the invention described above, it is preferable that a floating solid impurity mixed in the melting solution accommodated in the inner crucible is discharged to the outer crucible side by the operation, and the solid impurity floats over a surface of the melting solution accommodated in the outer crucible.

According to the invention described above, in the case in which the solid impurity floats on the surface of the metal fluoride melting solution in the start of the pulling, the accommodating depth of the inner crucible with respect to the outer crucible is once reduced to cause a full amount of the single crystal material melting solution accommodated in the inner crucible to flow into the outer crucible and the accommodating depth of the inner crucible with respect to the outer crucible is then increased again to feed, into the inner crucible, the raw metal fluoride melting solution in the outer crucible. Thus, it is possible to carry out the pulling in a state in which the solid impurity is removed toward the outer crucible side.

Accordingly, the as-grown single crystal of the metal fluoride which is obtained can be prevented from containing the solid impurity in an inner part. In addition, it is possible to prevent a partial polycrystallization from being generated due to the solid impurity.

In the pulling apparatus described above, the present invention provides an apparatus for pulling a metal fluoride single crystal, wherein a shielding member for shielding at least a part of a portion between the internal surface of the sidewall of the outer crucible and the external surface of the sidewall of the inner crucible is provided in the opening portion or a position between the internal surface of the sidewall of the outer crucible and the external surface of the sidewall of the inner crucible below the opening portion.

In this case, in an embodiment, the shielding member is fixed to either the inner crucible or the outer crucible and is not fixed to the other crucible.

In another embodiment, moreover, the shielding member is fixed to neither the inner crucible nor the outer crucible.

The present invention provides a process for producing a metal fluoride single crystal using the pulling apparatus described above, comprising:

accommodating a raw metal fluoride melting solution in each of hollow portions of an outer crucible and an inner crucible in a double structured crucible;

moving a single crystal pulling bar downward until a seed crystal attached to a tip of the single crystal pulling bar comes in contact with a surface of the melting solution accommodated in the inner crucible; and then pulling the single crystal pulling bar gradually to grow a metal fluoride single crystal in a state in which at least a part of an upper portion of the surface of the melting solution accommodated in the outer crucible is shielded from an outside by the shielding member.

In the invention described above, it is preferable to comprise:

accommodating raw metal fluoride and a scavenger in a gap space between an internal surface of the outer crucible and an external surface of the inner crucible in the double structured crucible and then heating and melting the raw metal fluoride in a state in which at least a part between an internal surface of a sidewall of the outer crucible and an external surface of a sidewall of the inner crucible above the raw metal fluoride and the scavenger which are accommodated is shielded from the outside by the shielding member;

increasing an accommodating depth of the inner crucible with respect to the outer crucible, thereby causing a part of the raw metal fluoride melting solution accommodated in the gap space to flow into a hollow portion of the inner crucible;

moving a single crystal pulling bar downward until a seed crystal attached to a tip of the single crystal pulling bar comes in contact with a surface of the melting solution accommodated in the inner crucible; and then pulling the single crystal pulling bar gradually to grow a metal fluoride single crystal in a state in which at least a part of an upper portion of the surface of the melting solution accommodated in the outer crucible is shielded from the outside by the shielding member.

According to the invention described above, it is possible to considerably suppress the generation of a crystal cut and the mixture of bubbles during a crystal growth. Therefore, a large-sized metal fluoride single crystal, which is particularly hard to produce stably, can be produced stably and efficiently. The effect is particularly remarkable in the case in which the crystal growth (pulling) of the metal fluoride single crystal is carried out under a reduced pressure.

In the case in which the solid scavenger is put into the crucible together with the raw metal fluoride to produce the single crystal, furthermore, it is possible to obtain an as-grown single crystal having a high vacuum ultraviolet light transmittance.

According to the present invention, the crucible has the double structure. Therefore, it is possible to stably grow the single crystal in the shallow state of the melting solution in which the formation of the scattering bodies is highly suppressed from the start of the pulling to the end.

Moreover, the outer crucible and the inner crucible are caused to partially communicate with each other, and furthermore, the opening portion is provided between these sidewalls. Consequently, it is possible to prevent the solid impurity from being contained in the inner part of the as-grown single crystal. In addition, it is also possible to prevent a partial polycrystallization from being generated due to the solid impurity.

Furthermore, the shielding member is provided in the opening portion or the position between the internal surface of the sidewall of the outer crucible and the external surface of the sidewall of the inner crucible below the opening portion. Consequently, it is possible to suppress the generation of a crystal cut, the mixture of bubbles or the generation of a solidification at the bottom of a crucible during the crystal growth, thereby producing a large-sized single crystal of the metal fluoride stably and efficiently. Furthermore, it is possible to produce a single crystal having a high vacuum ultraviolet transmittance in the vacuum ultraviolet wavelength region.

DETAILED DESCRIPTION OF THE INVENTION

In the present invention, metal fluoride is not particularly restricted but specific examples thereof include calcium fluoride, magnesium fluoride, strontium fluoride, barium fluoride, lithium fluoride, aluminum fluoride, cerium fluoride, and metal fluoride containing two types of cationic elements or more such as $BaLiF_3$, $KMgF_3$, $LiCaALF_6$ and the like, and substances in which the above metal fluoride is doped with a specific metal element, for example, an alkaline earth metal element such as calcium, magnesium, strontium and barium, a rare earth element such as lanthanum, cerium, gadolinium and ytterbium, and the like. In particular, the effects can be exhibited most remarkably in alkaline earth metal fluoride such as calcium fluoride, magnesium fluoride, strontium fluoride and barium fluoride, and furthermore, an industrial value of a target is also high.

Figure 1:
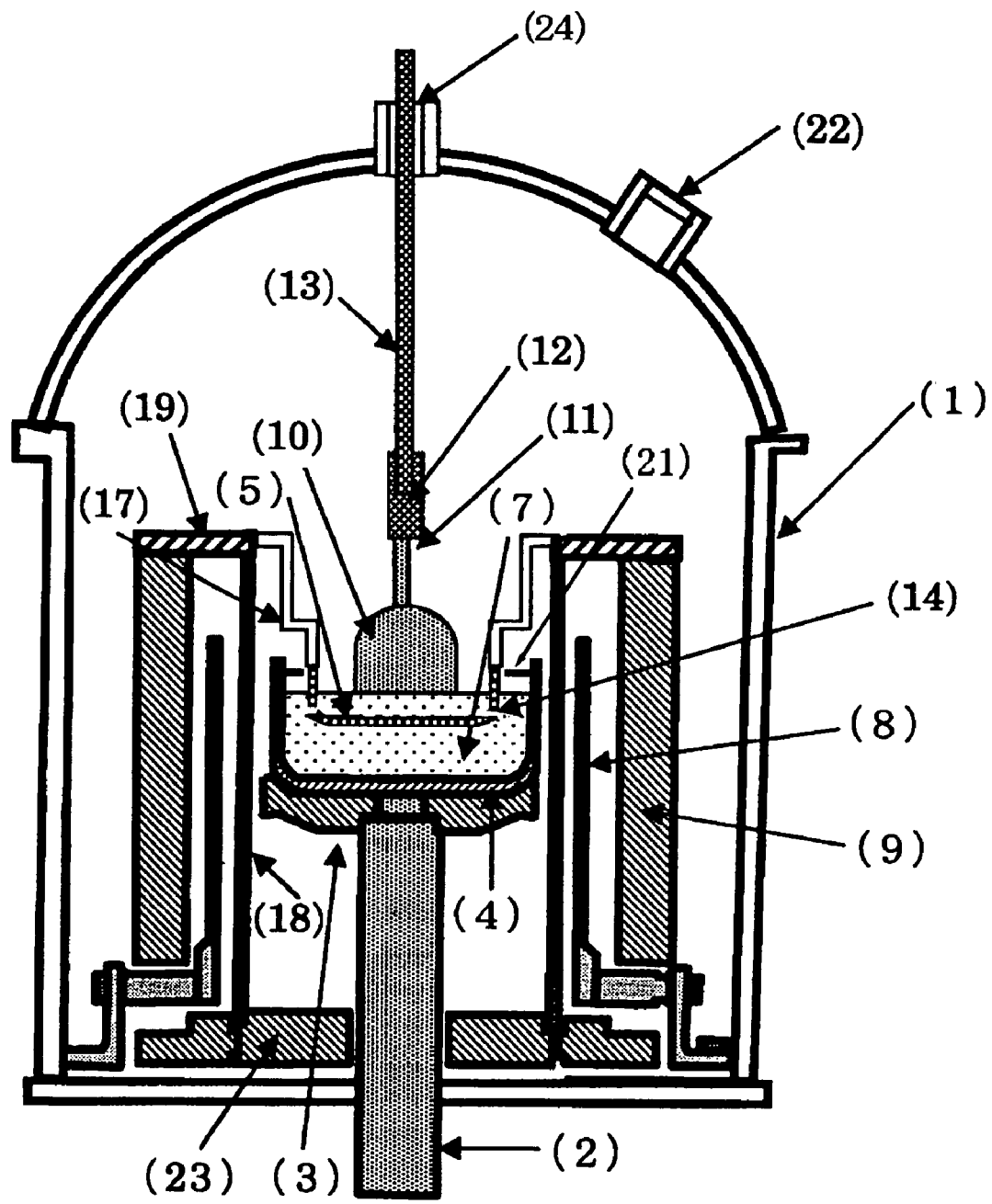
FIG. 1 is a sectional view showing an embodiment of an apparatus for pulling a metal fluoride single crystal according to the present invention.
Figure 2:
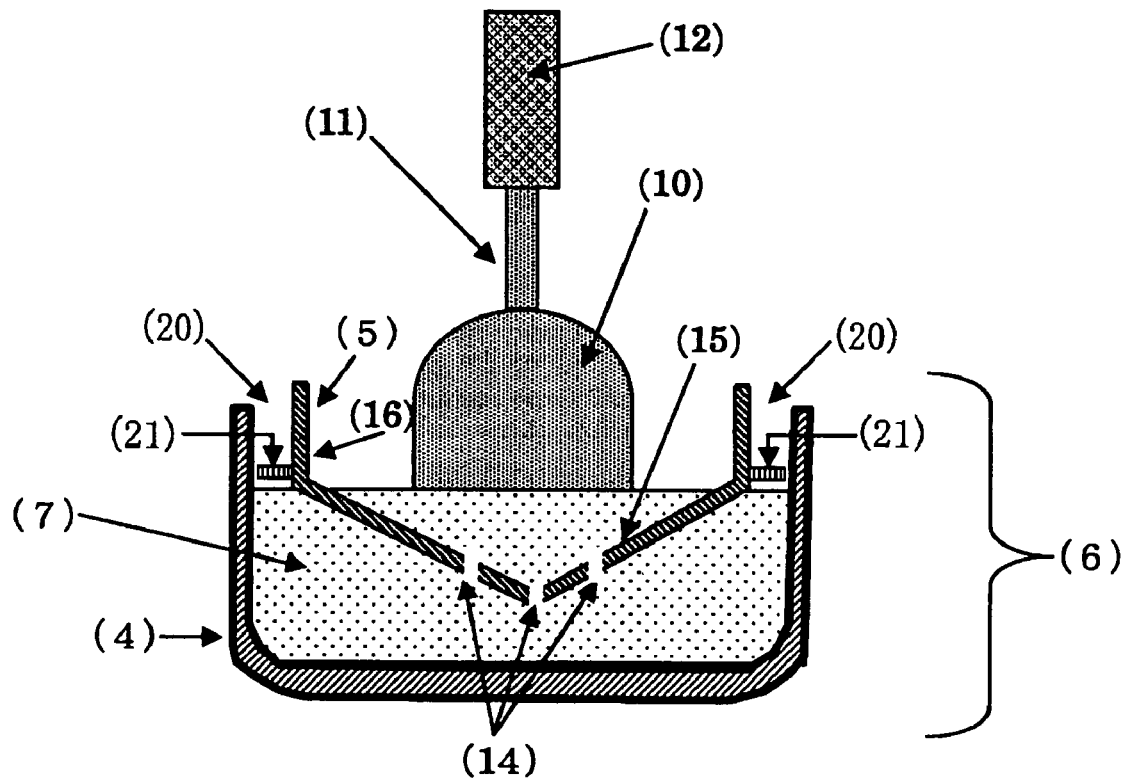
FIG. 2 is an enlarged sectional view showing a double structured crucible of an apparatus for pulling a metal fluoride single crystal according to another embodiment of the present invention.

The pulling apparatus according to the present invention serves to grow (pulling) a single crystal of the metal fluoride. For a structure, it is possible to employ, without limit, a structure of a well-known pulling apparatus which is used for producing a conventional metal fluoride single crystal except a portion of a crucible which will be described below. FIG. 1 is a sectional view showing an embodiment of an apparatus for pulling a metal fluoride single crystal according to the present invention, and FIG. 2 is an enlarged sectional view showing a double structured crucible of an apparatus for pulling a metal fluoride single crystal according to another embodiment of the present invention.

In the pulling apparatus shown in FIG. 1, a double structured crucible (6) formed by an outer crucible (4) and an inner crucible (5) having a function which will be described below is mounted on a receiving table (3) supported on a support shaft (2) which is rotatable in a chamber (1), and a raw metal fluoride melting solution (7) is accommodated in each of the crucibles.

A heater (8) is provided around the outer crucible (4), and furthermore, a heat insulating wall (9) is provided around the heater (8). The heat insulating wall (9) is also provided below the double structured crucible (6).

It is preferable that a height of an upper end of the heater (8) should be almost equal to or slightly greater than that of an upper end of the outer crucible (4). Moreover, it is sufficient that the heat insulating wall (9) surrounds a portion from a lower end of the outer crucible (4) to the upper end. The heat insulating wall (9) preferably surrounds a space positioned above the outer crucible (4) in which a metal fluoride single crystal (10) is pulled in order to slowly cool the pulled single crystal.

A partition wall (18) may be provided circumferentially between the heater (8) and the outer crucible (4) in order to cause a radiant heat from the heater (8) to be uniform. In order to prevent the heat of the heater (8) from escaping upward, it is preferable that an upper end of the partition wall (18) should be set to be higher than that of the heater (8) and a lid member (19) for blocking a gap between the partition wall (18) and the heat insulating wall (9) should be provided between the upper end and the heat insulating wall (9) to block the gap.

A rotatable single crystal pulling bar (13) having a holding tool (12) of a seed crystal (11) attached to a tip is suspended on a central axis of the inner crucible (5). The seed crystal (11) is gradually pulled after a lower end face comes in contact with the raw metal fluoride melting solution (7) in the inner crucible (5) so that the single crystal (10) is grown in a lower part.

A lower end of the support shaft (2) penetrates through a bottom wall of the chamber (1) and is thus extended to an outside of the chamber, and comes in contact with a cooling device and is then connected to a mechanism for rotating the crucible, which is not shown. Structures other than the crucible portion in the pulling apparatus having the basic structure are preferable in that the apparatus described in Japanese Laid-Open Patent Publication No. 2004-182587 has a high uniformity of a temperature distribution in a single crystal pulling area and a metal fluoride single crystal can be produced well without generating a crack.

The pulling apparatus according to the present invention has the double structure (6) in which the crucible is constituted by the outer crucible (4) and the inner crucible (5) as described above. In addition, the double structured crucible (6) can continuously change an accommodating depth of the inner crucible (5) with respect to the outer crucible (4).

As shown in an enlarged sectional view of FIG. 2 (the embodiment of the inner crucible in the double structured crucible is different from that of the pulling apparatus in FIG. 1), in the double structured crucible (6), a gap space formed by the internal surface of the outer crucible (4) and the external surface of the inner crucible (5) (which will also be referred to as a hollow portion of the outer crucible) and a hollow portion of the inner crucible (5) are caused to partially communicate with each other by a method of providing at least one communicating hole (14) on the wall portion of the inner crucible (5).

For this reason, in the crucible having the structure, when the raw metal fluoride melting solution (7) accommodated in the inner crucible (5) is decreased with the growth of the single crystal, the accommodating depth of the inner crucible (5) with respect to the outer crucible (4) can be increased to supplement the melting solution (7) from the outer crucible (4) into the inner crucible (5) according to an amount of the decrease. As a result, the growth of the single crystal can be carried out while the depth of the raw metal fluoride melting solution (7) is maintained to be constant in the inner crucible (5) from a start of the pulling to an end in the pulling apparatus, and the depth of the melting solution (7) can be maintained in the shallow state in which the formation of the scattering bodies can be suppressed highly for the full period of the pulling.

In the double structured crucible (6), it is preferable that the depth of the raw metal fluoride melting solution (7) to be accommodated in the inner crucible (5) can be set to be equal to or less than 0.65 times as great as the diameter of the straight barrel portion of the as-grown single crystal to be pulled. For a period which is as long as possible from the start of the pulling to the end, suitably, a full period, it is preferable to supplement the melting solution (7) from the outer crucible (4) to the inner crucible (5) in order to maintain the depth.

The depth of the crucible in a conventional pulling apparatus used for producing a metal fluoride single crystal is usually approximately 3 to 5 times as great as the diameter of the straight barrel portion of the as-grown single crystal. When the raw metal fluoride melting solution (7) is accommodated in a sufficient amount in the crucible, the depth of the melting solution is set to have a value which is an approximately double even if it is smaller than the diameter of the straight barrel portion. Also at the end of the pulling, an amount of the solution which exceeds 0.75 time as large as the diameter of the straight barrel portion usually remains.

When the single crystal is pulled in a state in which the depth of the melting solution is thus great, the influence of a natural convection for the flow of the melting solution is increased so that the flow is complicated together with a forcible convection through the rotation of the single crystal and the crucible, and a temperature distribution in the vicinity of the interface of the growth of the single crystal becomes unstable.

In a state in which the temperature distribution in the vicinity of the interface of the crystal growth is unstable, a large number of holes causing the scattering bodies are formed in the single crystal in the growth of the single crystal. On the other hand, if the depth of the melting solution is decreased to be the depth which is equal to or less than 0.65 time as great as the diameter of the straight barrel portion of the as-grown single crystal, the natural convection causing such holes is greatly reduced so that it is possible to remarkably decrease the number of the scattering bodies present in the single crystal which is pulled.

In the present invention, the scattering bodies are an internal defect which is found visually as a shiny grain scattering a light through an observation under a light concentrating illumination, and the grain generally has a maximum diameter of 100 μm or less and a grain having a size of 10 to 100 μm is usually observed. In the actual conditions, moreover, most of the scattering bodies are holes and they generally take square shapes such as an octahedron. These scattering bodies usually have planes which are almost aligned in a specific orientation of the single crystal, and a scattered light is observed in only a specific direction determined by an incident light and the orientation of the single crystal when a laser beam is irradiated. From these results, the holes are supposed to be negative crystals.

The depth of the raw metal fluoride melting solution (7) to be accommodated in the inner crucible (5) is more preferably equal to or less than 0.55 time as great as the diameter of the straight barrel portion of the as-grown single crystal, and is further preferably equal to or less than 0.50 time as great as the same diameter in that the effect of suppressing the formation of the scattering bodies in the single crystal can be exhibited more remarkably.

In general, the depth of the raw metal fluoride melting solution (7) is equal to or smaller than 15 cm and is preferably equal to or smaller than 12 cm. At a crystal pulling step, moreover, the depth of the raw metal fluoride melting solution (7) to be accommodated in the inner crucible (5) is preferably equal to or more than 0.1 time as great as the diameter of the straight barrel portion of the as-grown single crystal and is more preferably equal to or greater than 3 cm in that the single crystal and the crucible, or the single crystal and a part of the raw material solidified on the bottom of the crucible can be prevented from coming in contact with each other.

It is preferable that the accommodating depth of the inner crucible (5) with respect to the outer crucible (4) should be continuously changed in such a manner that the depth of the melting solution (7) is set within the range described above for the pulling period, and the height of the single crystal pulling bar (13) should also be controlled according to the change in the height of the liquid surface. In the beginning of the start of the pulling, in some cases in which the amount of the raw fluoride melting solution (7) to be accommodated in the crucible is set to be slightly large, the depth of the melting solution exceeds the range. Also in such cases, it is preferable that the depth of the melting solution should be set within the range for at least a period in which the straight barrel portion to be the most useful portion for cutting out an optical member is pulled.

Moreover, it is preferable that a fluctuation range of the depth of the melting solution should be reduced as greatly as possible in that a pulling (crystal growth) interface is stabilized more greatly even if the depth of the melting solution is set within the range at time of the pulling, and it is desirable that the depth of the melting solution should be substantially fixed to a predetermined value to execute the pulling. For at least a period in which the straight barrel portion having a high usefulness is pulled, it is particularly preferable that the depth of the melting solution (7) in the inner crucible (5) should be substantially fixed to the predetermined value to execute the pulling.

In the double structured crucible (6), it is desirable that a size of the inner crucible (5) should be determined according to a size of the metal fluoride single crystal to be produced. In other words, it is sufficient that an inside diameter of the inner crucible (5) should be greater than a maximum value of the diameter of the metal fluoride single crystal to be produced. In some cases in which the inside diameter of the inner crucible (5) is excessively great, however, the effect of suppressing a volatilization of metal fluoride is reduced when a shield member to be described below is provided. On the other hand, in some cases in which the inside diameter excessively approximates to a maximum value of the diameter of the single crystal, a disorder of the melting solution (7) or the like is generated easily so that it is difficult to stably pull the crystal. For this reason, the inside diameter is preferably 1.1 to 4 times, more preferably 1.1 to 2.5 times, particularly preferably 1.2 to 2 times as great as the maximum value of the diameter of the single crystal to be produced. Usually, the diameter of the straight barrel portion of the single crystal to be produced takes the maximum value of the diameter of the single crystal.

Moreover, it is preferable that the depth of the inner crucible (5) should exceed a lower limit value within a suitable range of the depth of the raw metal fluoride melting solution (7) to be accommodated in the inner crucible (5). More specifically, the depth is preferably set to be more than 0.1 time as great as the diameter of the straight barrel portion of the as-grown single crystal to be pulled, and is more preferably set to be greater than 3 cm.

On the other hand, in some cases in which the depth of the inner crucible (5) is excessively great, an operability of the pulling is deteriorated. From this viewpoint, it is preferable that the depth of the inner crucible (5) should be slightly greater than an upper limit value, at a maximum, within a suitable range of the depth of the raw metal fluoride melting solution (7) accommodated in the inner crucible (5) (which is 0.65 time as great as the diameter of the straight barrel portion of the as-grown single crystal to be pulled) as described above.

However, the upper end of the inner crucible (5) greatly influences a heat radiant state. For this reason, it is preferable that the upper end should be separated from the surface of the melting solution to be the crystal growth interface, that is, the depth of the inner crucible (5) should be greater.

In consideration of the elements described above, the depth of the inner crucible is preferably 0.5 to 3 times, more preferably 0.65 to 2 times as great as the diameter of the straight barrel portion of the as-grown single crystal to be pulled. By means for causing the inner crucible (5) to be separable or the like, it is possible to particularly prevent problems from being caused in relation to the operability. In such a case, accordingly, it is suitable that the depth should be set to be greater than the upper limit value in respect of the heat radiation.

There is used the outer crucible (4) having a diameter corresponding to the size of the single crystal to be pulled and a sufficient depth for accommodating the raw metal fluoride melting solution (7) which is necessary for the pulling. In consideration of a smoothness of the supplement of the melting solution (7) into the inner crucible (5), it is preferable that the depth of the outer crucible (4) should be 1.3 to 3 times as great as the depth of the inner crucible (5).

Referring to the diameter of the outer crucible (4), an interval between an internal surface of the sidewall of the outer crucible (4) and an external surface of the sidewall of the inner crucible (5) is preferably set to be $1/10$ to $1/3$ of an inside diameter of the outer crucible (4) and is more preferably set to be $1/8$ to $1/4$ in an opening portion (20) in consideration of the effect of removing the solid impurity contained in the raw metal fluoride melting solution (7) (which will be described below). The internal surface of the sidewall of the outer crucible (4) and the external surface of the sidewall of the inner crucible (5) are usually extended in almost parallel with each other in a perpendicular direction within at least a range from the surface of the melting solution (7) to a position of the opening portion (20).

The inside diameter of the inner crucible (5) or the outer crucible (4) is a diameter of a portion having the greatest inside diameter in the crucible, and the depth is a length from the upper end of the crucible to the deepest position.

In the inner crucible (5), the shape of a bottom wall (15) surface is not particularly restricted but may be a horizontal plane like the inner crucible provided in the pulling apparatus in FIG. 1. However, a longitudinal section may take a downward convex shape such as a shape of a grinding bowl or an inverse truncated cone which is V, U or the like. In the double structured crucible (6) in FIG. 2, the bottom wall (15) surface has a longitudinal section taking a shape of V.

In the case in which the bottom wall (15) surface takes the downward convex shape, an inclination angle in a downward direction with respect to the horizontal plane of the bottom wall (15) surface is preferably 5 to 55 degrees, is more preferably 8 to 45 degrees and is particularly preferably 15 to 45 degrees in respect of a more enhancement in the effect of suppressing the generation of the scattering bodies. In the case in which the bottom wall (15) surface takes the shape of the inverse truncated cone, it is preferable that the diameter of the horizontal plane on a middle point of an axis of a circular cone should be equal to or smaller than $1/5$ of the inside diameter of the inner crucible (5).

In the present invention, in the case in which the bottom wall (15) surface of the inner crucible (5) takes the downward convex shape, the depth of the raw metal fluoride melting solution (7) accommodated in the inner crucible (5) implies a depth from the surface of the melting solution to the deepest portion on the bottom wall (15) surface of a hollow portion of the inner crucible (5).

The communicating hole (14) provided in the wall portion of the inner crucible (5) may be provided in an optional portion in the bottom wall (15) and a sidewall (16) depending on circumstances. Depending on the circumstances, a notch portion is provided on the upper end of the sidewall (16) of the inner crucible (5), and both hollow portions of the outer crucible (4) and the inner crucible (5) may communicate with each other through the notch portion. In this case, the melting solution (7) accommodated in the outer crucible (4) is caused to overflow from the notch portion and is supplemented into the inner crucible (5) by increasing the accommodating depth of the inner crucible (5) with respect to the outer crucible (4).

However, it is effective that the communicating hole (14) is provided in the wall portion of the inner crucible (5) which is as low as possible in respect of a stability of the surface of the melting solution accommodated in the inner crucible (5). As in the inner crucible (5) shown in FIG. (1), it is preferable that the communicating hole (14) should be provided on a lowermost end of the sidewall or the bottom wall in the case in which the bottom wall of the inner crucible (5) takes a horizontal shape.

Figure 3:
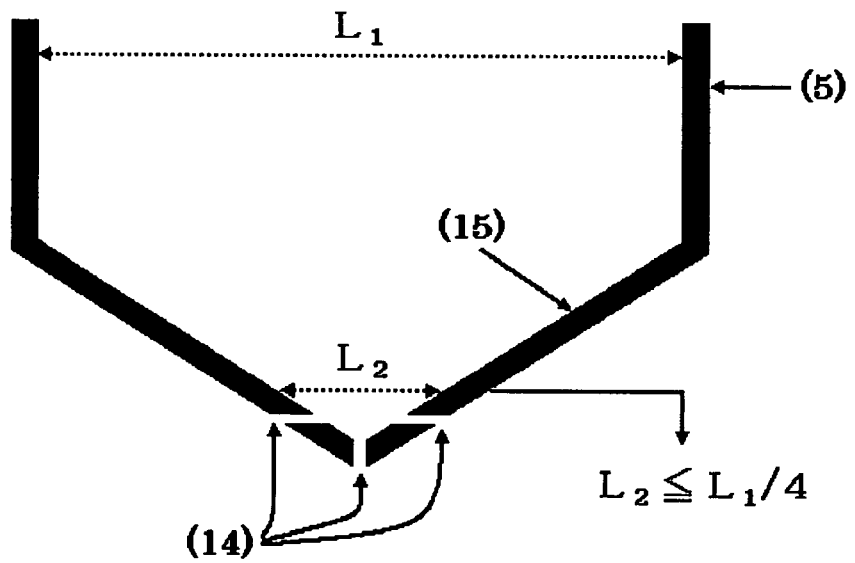
FIG. 3 is a sectional view for explaining a preferred position in which a communicating hole is disposed in an inner crucible having a bottom wall taking a downward convex shaper.

On the other hand, in the case in which the bottom wall (15) takes the downward convex shape as in the inner crucible (5) shown in FIG. 2, the communicating hole (14) is preferably provided in a lower position than a position in which the inside diameter of the bottom wall portion is equal to or smaller than $1/4$ of the inside diameter of the inner crucible (5) and is more preferably provided below a position of $1/7$ or less (see FIG. 3).

Furthermore, it is preferable that at least one communicating hole should be provided in the deepest portion of the inner crucible (5) in that the removal of the solid impurity which will be described below can efficiently be carried out.

If an opening area of the communicating hole (14) is too small, the melting solution (7) cannot be smoothly supplemented from the outer crucible (4) into the inner crucible (5). On the other hand, if the opening area is too great, there is a possibility that the stability of the surface of the melting solution (7) accommodated in the inner crucible (5) might be deteriorated. For this reason, it is preferable that the opening area should be 0.05 to 0.8% of an opening area of the upper end of the inner crucible (5).

It is preferable that the communicating hole (14) should be provided as a plurality of small holes, suitably, 4 to 100 small holes having a diameter of 2 to 8 mm in place of one hole having a large diameter in respect of the stability of the surface of the melting solution accommodated in the inner crucible (5). In the case in which the communicating hole (14) is provided as the small holes, thus, it is preferable that the respective holes should be provided without an uneven distribution as greatly as possible and is particularly preferable that they should be provided symmetrically from a center of the inner crucible (5).

The shape of the communicating hole (14) is not particularly restricted but is usually cylindrical. An axial direction of the hole is usually a perpendicular direction in the case in which the wall portion on which the hole is formed is a horizontal bottom wall, and is usually a horizontal direction in the case in which the wall portion is a sidewall and may be provided with a slight inclination with respect to these walls. In the case in which the wall portion forming the hole is an inclined wall in the bottom wall portion taking the downward convex shape, it is sufficient that the axial direction of the hole is set to have a proper angle from the perpendicular direction to the horizontal direction.

When the accommodating depth of the inner crucible (5) with respect to the outer crucible (4) is to be continuously changed in the double structured crucible (6), it is preferable that one of the outer crucible (4) and the inner crucible (5) should be positioned and fixed to the chamber (1) and the other crucible should be continuously moved vertically. In the case in which there is employed a structure in which the outer crucible (4) is positioned and fixed to the chamber and the inner crucible (5) can be continuously moved vertically in the chamber, the pulling interface of the single crystal is lowered with passage of time when the single crystal is to be grown with the depth of the raw metal fluoride melting solution (7) maintained within the certain range. Consequently, there is a possibility that a heating environment from the heater (8) might be changed finely.

Accordingly, it is preferable to employ a structure in which the inner crucible (5) is positioned and fixed to the chamber (1) and the outer crucible (4) is continuously moved vertically in the chamber in respect of the stable growth of the single crystal.

More specifically, it is preferable to employ a structure in which the support shaft (2) can be continuously moved vertically so that the outer crucible (4) to be mounted thereon can also be moved vertically by a driven operation, and furthermore, the inner crucible (5) is bonded to a connecting member (17), of which one end is fixed to the chamber (1) or an inner member thereof, and is positioned and fixed into the chamber.

The connecting member (17) may be suspended from an upper member in the chamber (1) and may be provided transversely from a side member in the chamber (1). In the latter case, the connecting member (17) is provided to have a sufficient height above the outer crucible (4) in order not to disturb the vertical motion thereof. In case of the pulling apparatus in FIG. 1, the bar-shaped connecting member (17) is bonded and fixed to the lid member (19).

A well-known mechanism is applied to a mechanism for vertically moving the support shaft (2), and the outer crucible (4) is precisely lifted by means of the mechanism in such a manner that, in response to a decrease of the melting solution (7) accommodated in the inner crucible (5) with the growth of the single crystal, the same amount of the melting solution (7) is supplemented from the outer crucible (4) into the inner crucible (5).

Preferably, the production of the metal fluoride single crystal using the pulling apparatus of the present invention having the structure described above can be executed by the method as described above, in the growth of the metal fluoride single crystal (10) in accordance with the single crystal pulling method. That is, the method comprises increasing the accommodating depth of the inner crucible (5) with respect to the outer crucible (4) according to the decrease of the raw metal fluoride melting solution (7) accommodated in the inner crucible (5) with the growth of the single crystal (10) and supplementing the raw metal fluoride melting solution (7) accommodated in the outer crucible (4) into the inner crucible (5) in such a manner that the amount of the raw metal fluoride melting solution (7) in the inner crucible (5) is maintained within a certain range, suitably, the amount of the melting solution in the inner crucible (5) is maintained to have a depth of 3 cm or more within a range which is at least 0.65 time as great as the diameter of the straight barrel portion of the single crystal (10).

According to this method, it is possible to produce an as-grown single crystal of the metal fluoride in which the number of scattering bodies present in the single crystal is considerably small. Referring to the remarkableness of the effect, it is preferable that the as-grown single crystal to be produced should have a large size in which a straight barrel portion has a diameter of 50 mm or more and a length of the straight barrel portion is equal to or greater than 40 mm.

As described above, in the growth of the large-sized metal fluoride single crystal, a large number of scattering bodies can easily be formed in the single crystal. In the production method according to the present invention, however, an excellent suppressing effect for the formation of the scattering bodies can also be exhibited in the pulling of the large-sized metal fluoride single crystal.

According to the present invention, therefore, it is possible to obtain, as the large-sized metal fluoride as-grown single crystal, an as-grown single crystal in which the number of scattering bodies present in the whole straight barrel portion is equal to or smaller than $0.01/cm^3$, is preferably equal to or smaller than $0.005/cm^3$, and is further preferably 0 to $0.002/cm^3$ or an as-grown single crystal in which the number of scattering bodies present in the whole as-grown single crystal including a shoulder portion or the like is equal to or smaller than $0.03/cm^3$, is preferably equal to or smaller than $0.01/cm^3$, and is further preferably 0 to $0.005/cm^3$.

According to this method, furthermore, if the outer crucible (4) is set to have a sufficient capacity, the melting solution (7) can be prevented from being insufficient in the middle of the pulling however shallow the melting solution in the inner crucible (5) from which the single crystal (10) is pulled may be. According to the method described above, therefore, it is possible to well produce a very large as-grown single crystal which cannot be pulled in the state in which the melting solution is shallow by using a normal crucible and in which a straight barrel portion has a diameter of 150 mm or more or a length of 100 mm or more, or both the diameter and the length of the straight barrel portion are satisfied. The method is useful for producing such an as-grown single crystal.

In the production of a metal fluoride single crystal through the method described above, moreover, in the case in which both hollow portions of the outer crucible and the inner crucible partially communicate with each other through a communicating port provided in the lower wall portion of the inner crucible in the double structured crucible of the pulling apparatus to be used, it is preferable that a next preoperation should be carried out at least once before the start of the pulling. More specifically, in the preoperation, the raw metal fluoride melting solution (7) is accommodated in each of the hollow portions of the outer crucible (4) and the inner crucible (5) of the double structured crucible (6), and then, the accommodating depth of the inner crucible (5) with respect to the outer crucible (4) is once made shallow and the raw metal fluoride melting solution (7) accommodated in the inner crucible (5) is caused to flow into the outer crucible (4), and thereafter, the accommodating depth of the inner crucible (5) with respect to the outer crucible (4) is increased again to feed, into the inner crucible (5), the raw metal fluoride melting solution (7) in the outer crucible (4).

Also in the case in which a floating solid impurity is contained in the raw metal fluoride melting solution (7) accommodated in the inner crucible (5), thus, the solid impurity is discharged toward the outer crucible (5) side together with a liquid flow when the melting solution (7) in the inner crucible (5) is caused to once flow into the outer crucible (5) by the operation.

The solid impurity floats over the melting solution (7) surface accommodated in the outer crucible. Even if the melting solution (7) is fed into the inner crucible (5) by again increasing the accommodating depth of the inner crucible (5) with respect to the outer crucible (4), therefore, the solid impurity does not reenter into the inner crucible (5).

By carrying out the preoperation at least once or repetitively at plural times according to the effect of removing the solid impurity during the pulling of the single crystal, consequently, it is possible to execute the pulling of the single crystal in a state in which the solid impurity does not float in the melting solution (7) accommodated in the inner crucible (5). As a result, the solid impurity is not taken into the as-grown single crystal which is produced. Therefore, a partial polycrystallization is also prevented from being generated on the single crystal due to the solid impurity.

In the preoperation, it is effective that the amount of the flow for each operation for causing the raw metal fluoride melting solution (7) accommodated in the inner crucible (5) to flow toward the outer crucible (5) side is increased as greatly as possible in order to well exhibit the effect of removing the solid impurity. It is preferable that a whole amount should be caused to flow if possible.

For this purpose, it is preferable that the communicating hole (14) to be formed on the inner crucible (5) should be provided in a portion of the inner crucible (5) which is as low as possible. From this meaning, it is preferable that the communicating hole (14) should be provided below a position in which the inside diameter of the bottom wall portion is equal to or smaller than ¼ of the inside diameter of the inner crucible (5) and is more preferable that the communicating hole (14) should be provided below a position of ½ or less. In particular, it is preferable that at least one communicating hole (14) should be provided on a lower end (the deepest portion) in order to cause the whole amount of the melting solution (7) in the inner crucible (5) to flow out.

While the crucible in the apparatus for pulling a metal fluoride single crystal of the present invention is the double structured crucible (6) in which the accommodating depth of the inner crucible with respect to the outer crucible can be changed continuously as described above, it is preferable that a shielding member (21) for shielding at least a part of a portion between the internal surface of the sidewall of the outer crucible (4) and the external surface of the sidewall of the outer crucible (5) should be provided in the opening portion (20) or a position between the internal surface of the sidewall of the outer crucible (4) and the external surface of the sidewall of the inner crucible (5) below the opening portion (20) as shown in FIGS. 1 and 2.

In the present invention, the "opening portion" implies a circular open surface which is provided between the internal surface of the sidewall of the outer crucible (4) and the external surface of the sidewall of the inner crucible (5) and upward opens a gap space formed by the external surface of the outer crucible (4) and the internal surface of the inner crucible (5).

In the growth of the metal fluoride single crystal, the surface of the raw metal fluoride melting solution (7) is usually positioned between the internal surface of the sidewall of the outer crucible (4) and the external surface of the sidewall of the inner crucible (5) below the shielding member (21).

In the embodiment shown in FIG. 2, the shielding member (21) is formed by a plate-shaped member extended from the external surface of the sidewall of the inner crucible (5) toward the outer crucible (4) side, and is fixed to the external surface of the sidewall of the inner crucible (5). In the present embodiment, the shielding member (21) takes a shape of a circular ring plate as seen from above, which is not shown.

In FIG. 2, an outer edge of the shielding member (21) is extended to the vicinity of the internal surface of the sidewall of the outer crucible (4). Consequently, the metal fluoride accommodated in the hollow portion of the inner crucible (4) is prevented from being volatilized from the opening portion (20).

In the case in which the shielding member (21) has the structure shown in FIG. 2, the outer edge of the shielding member (21) is not fixed to the internal surface of the sidewall of the outer crucible (4) in such a manner that the outer crucible (or the inner crucible) can be moved vertically. Furthermore, it is preferable that a certain gap should be present between the outer edge of the shielding member (21) and the inter surface of the sidewall of the outer crucible (4) in order to prevent the outer edge of the shielding member (21) from being rubbed against the internal surface of the sidewall of the outer crucible (4) with the vertical motion of the crucible or a vibration caused by various factors. On the other hand, it is preferable that the gap should be narrower in order to suppress the volatilization of the metal fluoride as greatly as possible.

An interval between the outer edge of the shielding member (21) and the internal surface of the sidewall of the outer crucible (4) is preferably equal to or greater than 0.05 mm, is more preferably equal to or greater than 0.1 mm and is further preferably equal to or greater than 0.5 mm, and furthermore, is preferably equal to or smaller than 30 mm, is more preferably equal or smaller than 10 mm and is further preferably equal to or smaller than 5 mm depending on the sizes of the outer crucible and the inner crucible, precision in a position in which these crucibles are to be moved vertically and the like. A preferable range of the interval is the same also in other embodiments, for example, the case in which the shielding member (21) is fixed to the outer crucible (4) as shown in FIG. 1, for example.

Figure 4:
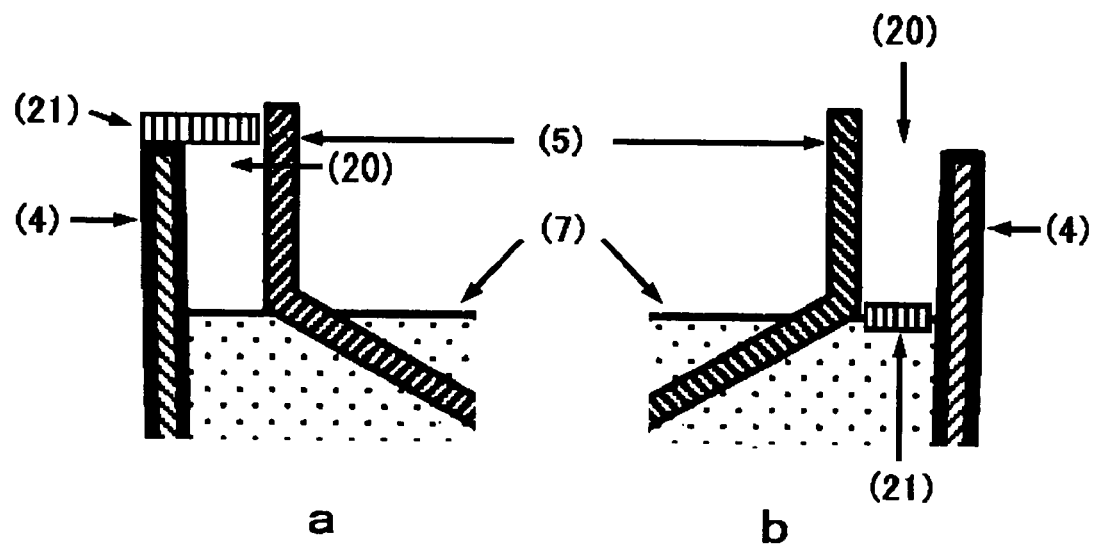
FIG. 4 is an enlarged sectional view showing a double structured crucible and a shielding member in an apparatus for pulling a metal fluoride single crystal according to yet another embodiment of the present invention.

While the shielding member (21) is fixed to the external surface of the sidewall of the inner crucible (5) in the embodiment shown in FIG. 2, it may be fixed to the internal surface of the sidewall of the outer crucible (4) as shown in FIG. 1 or it may be fixed to the upper end of the outer crucible (4) as shown in FIG. 4-a in the present invention. In the case in which the shielding member (21) is fixed to the crucible, it is preferable to fix the shielding member (21) to either of the crucibles which is not moved vertically because a change in a temperature environment can be suppressed in the case in which the crucible is moved vertically.

As described above, a manner for vertically moving the outer crucible is preferred in respect of a stable crystal growth in the present invention. From this viewpoint, therefore, it is particularly preferable that the shielding member (21) should be fixed to the inner crucible (5) as shown in FIG. 2.

When the outer crucible (4) is lifted with the progress of the pulling of the single crystal to supplement, into the inner crucible (5), the raw metal fluoride melting solution (7) accommodated in the outer crucible (4), thus, the position of the surface (the crystal growth interface) of the melting solution (7) with respect to the inner crucible is not substantially changed. Accordingly, a change in a relative position of the shielding member (21) fixed to the inner crucible (5) with respect to the melting solution surface is also small. Accordingly, the gap formed between the shielding member (21) and the surface of the melting solution (7) can be always maintained to be small and the volatilization of the metal fluoride material can easily be suppressed more greatly, and furthermore, it is also possible to easily control a temperature change in the melting solution with a change in an amount of the volatilization or the like.

In the case in which the shielding member (21) is fixed to the crucible, it is preferable that the shielding member (21) should be fixed to a position (height) in which the gap between the melting solution (7) and the shielding member (21) can be reduced as greatly as possible because the volatilization can be suppressed more efficiently. It is preferable that the gap should be specifically set to be approximately 1 to 20 mm. By fixing the shielding member (21) to one of the crucibles which is not moved vertically, moreover, it is possible to always maintain the gap to be small from the start of the pulling of the crystal to the end.

It is also possible to employ a manner, for example, a so-called drop lid for causing the shielding member (21) to float over the melting solution (7) without a fixation to the outer crucible (4) and the inner crucible (5) as shown in FIG. 4-b because the gap between the melting solution (7) and the shielding member (21) can be made small.

Thus, the drop lid is used for the shielding member (21) so that the gap is not generated between the melting solution (7) and the shielding member (21) and the volatilization of the metal fluoride can be prevented particularly efficiently. Also in this case, the size of the shielding member (21) is preferably set in such a manner that a certain gap is present without a contact with one of the crucibles which is moved vertically.

In a position in which the shielding member (21) is provided, a ratio of an area shielded by the shielding member (21) to a whole area of a horizontal plane between the internal surface of the sidewall of the outer crucible (4) and the external surface of the sidewall of the inner crucible (5) is preferably 80% or more, more preferably 90% or more, further preferably 95% or more, and particularly preferably 98% or more. The internal surface of the sidewall of the outer crucible (4) and the external surface of the sidewall of the inner crucible (5) are usually extended in almost parallel with each other in a perpendicular direction within at least a range from the vicinity of the position in which the shielding member (21) is provided to the position of the opening portion (20).

According to the investigations of the present inventors, such a shielding member (21) is provided so that there is further produced an effect that the growth (pulling) of the single crystal can be carried out more stably in addition to the effect described above which is obtained by setting the crucible to have the double structure. More specifically, it is possible to effectively prevent a crystal from being cut before reaching a predetermined pulling length during the pulling of the crystal or the crystal from containing bubbles though it is not cut.

According to the present invention, the reason why the above effects can be obtained is supposed as follows. When the metal fluoride single crystal is to be produced by using the apparatus of the present invention, the crystal growth is carried out in a state in which the raw metal fluoride melting solution (7) is present in the crucible. Such metal fluoride has a much higher volatility than other metal compounds (for example, oxide) and is volatilized in a comparatively large amount from the surface of the melting solution.

The metal fluoride which is volatilized is moved and diffused to various places in the apparatus for pulling the single crystal, and is condensed and solidified in contact with a low temperature member in the apparatus. It is supposed that the metal fluoride which is solidified is dropped for some reason and is also dropped and mixed into the melting solution in the crucible depending on circumstances.

It is supposed that the melting solution partially causes a reduction in a temperature and an impurity is often brought from the outside of the crucible when such a solidified matter is mixed into the melting solution. Furthermore, it is supposed that a physical disorder (wave) on the melting solution surface is generated due to a shock caused by the drop of the solidified matter.

It is supposed that these phenomena adversely influence the growth of the single crystal and the crystal is thus cut in a middle or bubbles are generated, resulting in the difficulty of a stable crystal growth.

In order to lessen the volatilization of the metal fluoride from the melting solution surface, it is preferable to reduce the interval between the internal surface of the sidewall of the outer crucible and the external surface of the sidewall of the inner crucible, thereby decreasing a surface area of the melting solution. In consideration of the effect of reducing the solid impurity contained in the melting solution as described above, however, it is preferable that the interval between the internal surface of the sidewall of the outer crucible and the external surface of the sidewall of the inner crucible, that is, a width of the opening portion should be present to some extent. When the interval between the internal surface of the sidewall of the outer crucible and the external surface of the sidewall of the inner crucible is considerably reduced, accordingly, the effect of the double structured crucible is reduced.

By providing the shielding member (21) as described above, however, it is possible to considerably reduce the amount of the metal fluoride volatilized from the opening portion (20). Even if there is a dropped matter, furthermore, it is possible to prevent the same matter from being dropped from the opening portion (20) into the melting solution (7).

By providing the shielding member (21), accordingly, it is possible to further avoid a bad influence on the crystal growth due to the volatilization, condensation, solidification and drop of the metal fluoride while obtaining the advantage of the double structured crucible according to the present invention at a maximum.

Furthermore, the volatilization of the metal fluoride is suppressed. Therefore, a change in a temperature situation of the melting solution can easily be suppressed. Consequently, it is possible to suppress the cut of a crystal and the generation of a solidification at the bottom of a crucible.

By providing the shielding member (21), moreover, it is possible to easily enhance a vacuum ultraviolet light transmittance (which will be hereinafter referred to as a VUV transmittance) of the single crystal which is produced. In the case in which a solid scavenger is used, particularly, the tendency becomes remarkable.

In many cases, the VUV transmittance is reduced when oxide is mixed as the impurity in the metal fluoride single crystal. For this reason, such oxide is usually removed as greatly as possible in a stage of the raw metal fluoride, and furthermore, a furnace itself is baked at several hundreds degrees to one thousand and several hundreds degrees before the raw metal fluoride is put into the furnace in order to remove a moisture causing the generation of the oxide.

However, it is hard to start the pulling of the crystal in a state in which the oxide and the moisture are completely removed because the moisture is adsorbed during the storage and transportation of the metal fluoride or the raw metal fluoride comes in contact with outside air when it is put into the furnace. For this reason, there is usually used a method of putting an oxygen removing agent referred to as a scavenger into the crucible together with the raw metal fluoride, and heating the raw metal fluoride and the scavenger while reducing a pressure and discharging the air, and converting the oxide into a volatile matter and removing the volatile matter prior to the start of the pulling of the crystal.

Various scavengers according to the type of the metal fluoride to be a producing object are well known, and there is usually used fluoride containing an element (having a high electronegativity) which is bonded to oxygen more easily than a metallic element constituting the metal fluoride and a compound having a higher volatility than the metal fluoride to be the producing object. For example, in the case in which the metal fluoride to be the producing object is calcium fluoride, there are known metal fluoride such as zinc fluoride, lead fluoride, silver fluoride or copper fluoride, hydrocarbon fluoride such as $CF_4$ or $CHF_3$ and the like. Such a scavenger is used also in the purification of the raw metal fluoride.

Description will be given by taking, as an example, the case in which the metal fluoride is calcium fluoride and the scavenger is zinc fluoride, and the functioning mechanism of the scavenger is supposed as follows. First of all, the zinc fluoride reacts to calcium oxide in raw calcium fluoride to generate zinc oxide and calcium fluoride. Consequently, the calcium oxide is removed from the material.

In the case in which the crucible or the like is formed by a carbon-based material such as graphite, furthermore, the zinc oxide which is generated is further reduced to metal zinc. Since the metal zinc which is generated and the unreacted zinc fluoride are volatilized more easily than the calcium fluoride, they can be removed by setting a high temperature and a low pressure.

While the description has been given by taking, as an example, the case in which the zinc fluoride is used as the scavenger for the calcium fluoride, it is said that other scavengers also remove the oxide by the same mechanism.

The above scavenge reaction itself has a higher reacting speed at a higher temperature and can be progressed reliably. However, the scavenger is volatile fluoride. For this reason, a rate of volatilization before a relation to the scavenge reaction is also increased with an increase in the temperature, and there is a problem in respect of a substantial reacting efficiency. A technique for increasing the amount of use of the scavenger can also be proposed. Consequently, there is a new problem in that an impurity in the scavenger easily has an influence.

However, the shielding member (21) is provided in the opening portion (20) or the position between the internal surface of the sidewall of the outer crucible (4) and the external surface of the sidewall of the inner crucible (5) below the opening portion so that the volatilization of the scavenger can be suppressed and a smaller amount of the scavenger can enhance the using effect thereof. At the same time, a volatile elimination is carried out with difficulty at a higher temperature. Therefore, the scavenge reaction can also be carried out efficiently.

Figure 5:
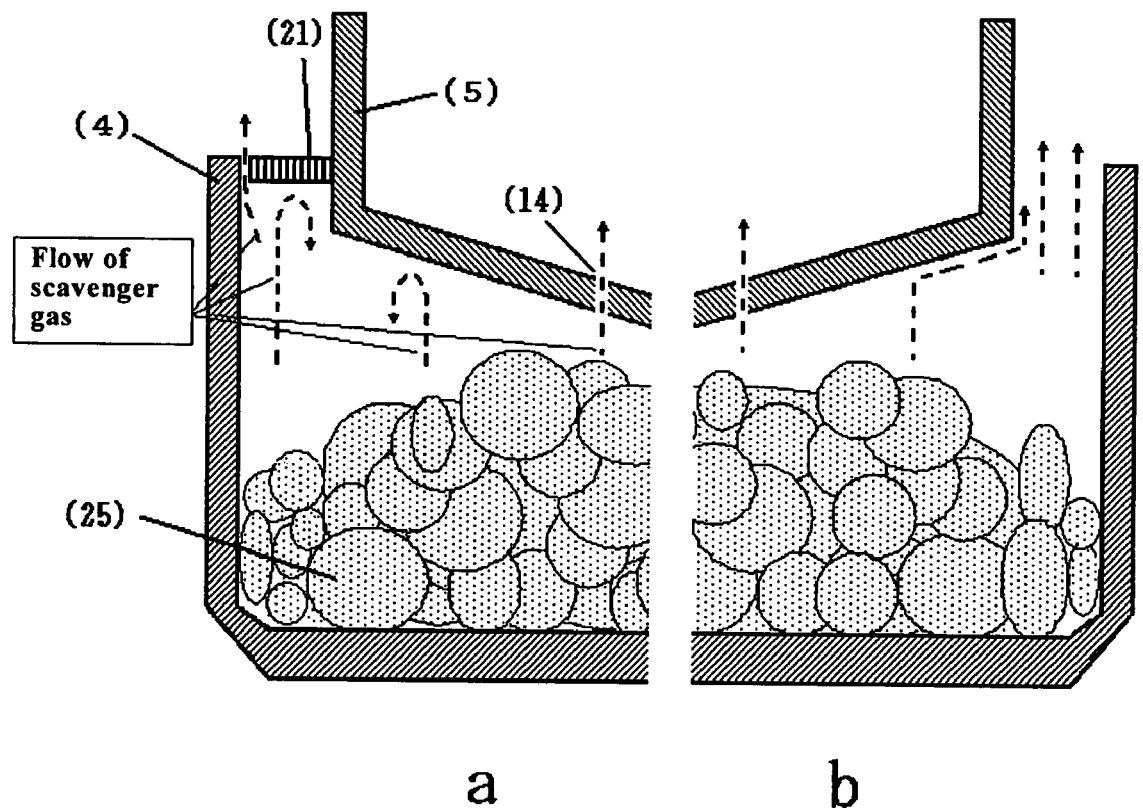
FIG. 5 is a typical view showing a state in which metal fluoride and a solid scavenger are put into a gap space in a double structured crucible and are heated in a further embodiment of the present invention.

More specifically, when raw metal fluoride (25) and a scavenger are accommodated in a gap space between the internal surface of the outer crucible (4) and the external surface of the inner crucible (5) and are thus heated as shown in FIG. 5-a, the scavenger is only volatilized from the communicating hole (14) and a slight gap between the outer edge of the shielding member (21) and the crucible wall. Therefore, the volatilization is considerably suppressed. For this reason, the scavenger stays in the space for a long time in a higher temperature state so that an efficiency for carrying out the scavenge reaction is increased. Consequently, it can be guessed that the VUV transmittance of the metal fluoride single crystal which is obtained is enhanced.

On the other hand, when the shielding member (21) is not provided as shown in FIG. 5-b, the scavenger is quickly volatilized from the opening portion (20) so that the effect is limited.

Also in the case in which the solid scavenger is not used, moreover, the volatilization of the raw metal fluoride can be suppressed by providing the shielding member (21), and the metal fluoride can be maintained easily at a higher temperature and a higher vacuum for a long time in a state in which it is put in the crucible. Therefore, it is possible to highly remove the moisture adsorbed into the chamber (1), the heat insulator (9) and the like. Consequently, it is possible to enhance the VUV transmittance of the metal fluoride single crystal which is obtained.

By using the apparatus for pulling a single crystal of the present invention in which the shielding member (21) is provided as shown in FIGS. 1, 2, 4 and 5-a, for example, a metal fluoride single crystal is produced in the following manner. First of all, the metal fluoride material and the solid scavenger if necessary are put in the space formed between the internal surface of the outer crucible and the external surface of the inner crucible in the double structured crucible and are thus heated. It is sufficient that the amount of use of the solid scavenger is properly set based on a purity of the raw metal fluoride or the like. It is preferable that the amount should be 0.01 to 5 parts by weight with respect to 100 parts by weight of the raw metal fluoride.

By the heating, the desorption of the adsorbed moisture is first caused. When the temperature is raised, furthermore, oxide in the metal fluoride or water adsorbed into the crucible or the like further reacts to the scavenger in the case in which the scavenger is used. The heating is preferably carried out with the evacuation of air and is more preferably carried out in a vacuum evacuation at an in-furnace pressure of approximately $10^{-3}$ to $10^{-5}$ Pa.

When the temperature is continuously raised, a temperature at which the metal fluoride starts to be sublimated (for example, approximately 1200° C. in case of calcium fluoride) is reached under the atmospheric pressure described above. At this time, in the case in which a crucible having a structure in which an upper part is opened as shown in FIG. 5-b is used, a large amount of the raw metal fluoride is volatilized. In order to prevent the inner part of the furnace from being contaminated, therefore, it is necessary to stop the evacuation of the air before reaching the sublimating temperature and to introduce an inert gas such as argon, thereby releasing the pressure.

However, it is possible to efficiently suppress the volatilization (sublimation) of the raw metal fluoride by providing the shielding member (21). Therefore, the temperature of the pressure release can be set to be higher than a sublimating start temperature. By maintaining a vacuum condition at a higher temperature than the sublimating start temperature, it is possible to remove the moisture adsorbed into the heat insulator or the like more highly.

In the case in which the shielding member (21) is provided, it is preferable to carry out the pressure release after sufficiently removing the moisture or the oxide in the furnace. It is preferable that the pressure release should be carried out at a lower temperature than a temperature at which the raw metal fluoride is molten.

A pressure in the pressure release may be a normal pressure or may be set in a pressure reducing state of approximately 0.5 to 70 kPa. By carrying out the crystal growth in the pressure reducing state, it is possible to suppress the generation of a minute void in a single crystal observed in a state of a cloudiness or a turbidity in an as-grown single crystal which is obtained or a substance obtained by annealing the as-grown single crystal, or both of them. In order to well suppress the generation of a minute void and to stabilize the growth of the single crystal more easily, the pressure in the pressure release is preferably 5 to 50 kPa and is more preferably 10 to 30 kPa.

Then, the temperature is further raised. After the raw metal fluoride is completely molten, the accommodating depth of the inner crucible (5) with respect to the outer crucible (4) is increased. Thus, a part of the melting solution accommodated in the space between these crucibles is caused to flow into the hollow portion of the inner crucible (5). The melting solution is caused to flow into the hollow portion of the inner crucible (5) through the communicating hole (14) and is accommodated therein.

Thereafter, it is preferable that the solid impurity removing operation described above should be carried out if necessary, and subsequently, the metal fluoride single crystal should also be pulled by the method described above.

In the solid impurity removing operation before the pulling of the single crystal, the position (height) of the melting solution surface with respect to the crucible on the side where the vertical motion is not carried out is changed. As described above, it is preferable that the shielding member (21) should be fixed to the crucible on the side where the vertical motion is not carried out. In this case, it is preferable that the position of the solution surface should not be higher than the shielding member (21) even if the position of the melting solution surface is the highest.

As described above, furthermore, it is preferable that the position of the melting solution surface should not be higher than the shielding member (21) also for a period in which the crystal is pulled.

According to the producing method described above, it is possible to prevent the single crystal from being cut in the middle of the pulling and bubbles from being mixed into the single crystal. Thus, it is possible to stably produce an as-grown single crystal of metal fluoride in which the VUV transmittance is high and the number of the scattering bodies present in the single crystal is remarkably small.

In the case in which a large-sized single crystal having a large diameter of a straight barrel portion and a great length of the straight barrel portion is produced, particularly, the effect described above is remarkable. More specifically, it is also possible to stably produce a large-sized single crystal in which a straight barrel portion has a diameter of 100 mm or more and a length of 40 mm or more. Furthermore, it is also possible to stably produce a very large-sized single crystal in which a straight barrel portion has a diameter of 150 to 300 mm and a length of 100 to 300 mm.

While the present invention has been described above based on the embodiments, it is not restricted to these embodiments but various modifications and changes can be made without departing from the scope thereof and they are included in the present invention.

Description will be given to the details of the pulling apparatus according to the present invention. For the heater (8), a resistance heater is preferable. In case of an induction heater, a temperature distribution in the furnace is apt to be steep. The resistance heater is advantageous in order to obtain a crystal of high quality.

It is preferable that the single crystal pulling bar (13), the support shaft (2), a view port (22) and the like should be hermetically sealed with an O ring, a magnetic fluid seal or the like. When a leakage is generated from these portions at the step of melting the raw metal fluoride or the step of growing the crystal, there is a possibility that a remarkable deterioration in quality, for example, the coloring of the single crystal, a reduction in a transparency or the like might be caused.

When the metal fluoride single crystal is grown by using the pulling apparatus of the present invention, it is preferable to change a pressure and an atmosphere in a single crystal growth furnace at each step. For this reason, an evacuating device such as a vacuum pump, and a gas introducing and discharging system such as piping for connecting the evacuating device to the furnace are usually provided in the pulling apparatus of the present invention.

It is possible to use a well-known vacuum pump for evacuating air from the chamber (1), and a combination of a rotary pump and an oil diffusion pump or the rotary pump and a molecular pump is preferable.

By providing a load cell for measuring a crystal growing speed on the single crystal pulling bar (13) or the support shaft (2) to feed back a measured value to a heater output or a crystal pulling speed, moreover, it is possible to obtain a single crystal having stable quality.

The members such as the double structured crucible (6), the support shaft (2), the receiving table (3) and the shielding member (21) are usually made from a carbon-based material such as graphite, glass-like graphite or silicon carbide deposited graphite, or a high melting point metal such as gold, a platinum-rhodium alloy or iridium. It is particularly preferable that these members should be made from the carbon-based material.

On the other hand, the heater (8), the heat insulating wall (9) and the like are usually made from a carbon-based material such as graphite, glass-like graphite or silicon carbide deposited graphite.

Moreover, it is preferable that the double structured crucible (6) should have such a structure as to be properly exchangeable with the outer crucible (4) and/or the inner crucible (5) having a different size and shape depending on a type and size of a metal fluoride single crystal to be produced.

In addition, preferred producing conditions for the case in which the metal fluoride single crystal is produced by using the pulling apparatus of the present invention are as follows.

Although a natural mineral, for example, fluorite in calcium fluoride or the like may be used as the raw metal fluoride, it is preferable to use a chemical synthesized product in respect of purity. As a suitable aspect, a ground matter of a single crystal obtained by the crucible depression method is used.

Powder may be used for the raw metal fluoride. However, a volume is decreased considerably in melting. For this reason, it is preferable to use a granular matter which preferably has a particle size of 60 μm or more and more preferably has a particle size of 60 to 1000 μm.

In the growth of the metal fluoride single crystal by the single crystal pulling method, when the moisture is present, oxide is taken into the single crystal so that coloring or the like is caused. For this reason, it is desirable to use the raw metal fluoride by removing contained moisture as greatly as possible.

A pretreatment for removing the moisture is carried out by heat treating the raw metal fluoride under a reduced pressure through a vacuum pump. However, it is hard to sufficiently remove the moisture in the raw material by simple burning. Therefore, it is preferable that the raw metal fluoride should be molten in an atmosphere containing carbon tetrafluoride, carbon trifluoride, ethane hexafluoride or the like as a gaseous scavenger after the heat treatment. For the gaseous scavenger, it is the most preferable that the carbon tetrafluoride should be used.

The raw metal fluoride subjected to the pretreatment may be exactly caused to grow the single crystal by the pulling method in the melting state. It is preferable that the raw metal fluoride should be once cooled and solidified and a solid impurity present on a surface thereof should be cut and removed as greatly as possible for use in order to reduce a polycrystallization.

Moreover, it is preferable that the apparatus for pulling a single crystal should also be heated and cleaned at a higher temperature than a temperate at which the crystal growth is carried out in the presence of fluoride such as zinc fluoride or lead fluoride before putting the raw metal fluoride. It is preferable to use, for the fluoride, the same scavenger as described above.

It is preferable that the raw metal fluoride should be molten in an atmosphere of an inert gas. It is preferable that the inert gas should be continuously supplied into the apparatus and carbon dioxide generated by a reaction of the scavenger and the residual moisture should be correspondingly discharged to the outside of the apparatus.

The single crystal is pulled at a temperature at which a temperature of the crystal growth interface of the metal fluoride is an almost melting point of the metal fluoride. However, it is hard to directly measure the temperature of the interface. Therefore, a technique for carrying out a control at a temperature of a bottom of the crucible is suitably used.

In this case, it is preferable that the single crystal should be pulled on a condition that the raw metal fluoride is heated to a range of a melting point to the melting point +150° C. at a measuring temperature of the bottom of the crucible, for example, at a temperature of approximately 1420° C. to 1570° C. if the metal fluoride is calcium fluoride. Moreover, a temperature raising speed to the temperature is preferably 50 to 500° C./Hr.

When removing a solid impurity floating in the melting solution before starting the pulling of the single crystal, it is also effective to carry out the removal with a higher temperature than a temperature for the execution of the pulling of the single crystal by 20 to 150° C. maintained for approximately 30 to 180 minutes.

Although an inert gas such as argon is preferable for an atmospheric gas during the pulling of the crystal, the crystal may be pulled in a fluorine-based gas atmosphere such as $CF_4$ or HF if necessary. During the pulling of the crystal, it is preferable that a new gas should not be supplied as greatly as possible. In the case in which the crystal is pulled at a normal pressure, it is preferable that a gas should be introduced and discharged so as to compensate for a change in a pressure with a change in a temperature. In the case in which the crystal is pulled under a reduced pressure, it is preferable that the pulling should be carried out in a state in which a single crystal growth furnace is closed tightly and sealed hermetically.

A seed crystal and a crystal which is being grown are preferably rotated around a pulling axis and a rotating speed is preferably 5 to 30 times/minute. With the rotation of the seed crystal, moreover, the crucible may be rotated at the same rotating speed in an opposite direction. The pulling speed of the crystal is preferably 1 to 10 mm/hour.

After the end of the pulling of the crystal, the cooling is usually carried out at a temperature dropping speed of 10° C./minute or less until the single crystal is taken out of the furnace. However, the cooling is preferably carried out at a temperature dropping speed of 0.5° C./minute or less, and more preferably approximately 0.1 to 0.3° C./minute because the as-grown single crystal which is obtained can easily be prevented from being cracked or broken when it is to be processed.

Moreover, it is also preferable that the temperature should be dropped under a vacuum evacuation at an in-furnace pressure of approximately $10^{-3}$ to $10^{-5}$ Pa because the generation of a negative crystal can easily be suppressed.

For the seed crystal to be used for pulling the single crystal, it is preferable to utilize a single crystal formed by the same material as the metal fluoride to be grown. It is possible to optionally select a growth plane of the seed crystal. In the case in which a seed crystal of calcium fluoride is used, however, it is possible to suitably use a {111} plane, a {100} plane and a {110} plane, and their equivalent planes.

EXAMPLE

While the present invention will be described below with reference to specific examples, it is not restricted to these examples.

In the following examples and comparative examples, the number of scattering bodies present in a whole inner part of the straight barrel portion of an as-grown single crystal and the number of the scattering bodies present in a whole inner part of the as-grown single crystal were measured by the following methods, respectively.

Measurement of Scattering Bodies

A water tank formed of glass was filled with matching oil (oil regulated to have a refractive index which is almost equal to a refractive index of a calcium fluoride single crystal) in such an amount that a whole single crystal to be a measuring object can be immersed and an as-grown body was stationarily put therein. Next, a white light of a halogen lamp was irradiated in one direction and the single crystal was rotated, a viewpoint was changed to search for a position in which a light scattered from a scattering bodies can be observed, and the number of the scattering bodies present in the measuring object was measured with eyes.

Example 1

The structure shown in FIG. 2 was used as the double structured crucible (6) except that the shielding member (21) was not provided, and furthermore, the apparatus for pulling a single crystal having the structure shown in FIG. 1 was used to produce a calcium fluoride single crystal except that the heat insulating wall (9) surrounding the space in which the metal fluoride single crystal (10) is pulled and a ceiling board are provided as described in Japanese Laid-Open Patent Publication No. 2004-182587.

In the apparatus for pulling a single crystal, the outer crucible (4) formed of high purity graphite which is provided in the chamber (1) had an inside diameter of 38 cm (an outside diameter of 40 cm) and a depth of 30 cm.

The inner crucible (5) fixed to the lid member (19) of the chamber through the connecting member (17) and accommodated in the outer crucible (4) in this state had an inside diameter of 25 cm (an outside diameter of 26 cm) and a height of 14 cm.

The bottom wall of the inner crucible (5) had a longitudinal section taking a V-shape (a shape of a grinding bowl) in which an inclination angle in a downward direction with respect to a horizontal plane was 15 degrees. The bottom wall was provided with nine cylindrical communicating holes (14) having a diameter of 4 mm in total, that is, one communicating hole on a lower end (central part) thereof and eight communicating holes at an equal interval over a circumference in a position placed upward apart from the central part along the bottom wall surface by 25 mm (a total opening area of these communicating holes was 0.2% of an opening area of the upper end of the inner crucible).

The heat insulating wall (9) was a pitch system graphite molded heat insulator and a radiating capability in a vertical direction was 9 W/m²·K. Moreover, the ceiling board provided thereabove was formed of graphite and the radiating capability in the vertical direction was 5000 W/m²·K.

A raw calcium fluoride lump subjected to a sufficient purification treatment and moisture removal treatment was put in a total amount of 40 kg into the outer crucible (4) and the inner crucible (5), and furthermore, 4 g of high purity zinc fluoride was put as a scavenger into the inner crucible (5), and they were disposed in the chamber (1). Then, air was evacuated from the inner part of the chamber (1) ($5 \times 10^{-6}$ torr or less) and the heater (8) was conducted to start to heat the material, and the temperature was raised to 250° C. and the temperature was held for 2 hours. Thereafter, the rise in the temperature was started again. When the temperature reached 600° C., a vacuum evacuating line was blocked and high purity argon was supplied into the chamber (1), and an internal pressure was maintained to be 106.4 KPa.

In a state in which the material was completely molten and the raw calcium fluoride melting solution (7) was accommodated in the outer crucible (4) and the inner crucible (5), the temperature was held at 1480° C. for 40 minutes, and a heater output was then lowered and the temperature was held at 1440° C. for 120 minutes.

The surface condition of the melting solution (7) accommodated in the inner crucible (5) was observed through the view port (22). Consequently, the float of a solid impurity was confirmed. Therefore, the support shaft (2) was moved downward to reduce the accommodating depth of the inner crucible (5) with respect to the outer crucible (4), thereby causing a full amount of the melting solution (7) accommodated in the inner crucible (5) to flow into the outer crucible (4). Then, the support shaft (2) was moved upward again to increase the accommodating depth of the inner crucible (5) with respect to the outer crucible (4), thereby supplying, into the inner crucible (5), the raw calcium fluoride melting solution (7) in the outer crucible (4).

After the operation, the accommodating depth of the inner crucible (5) with respect to the outer crucible (4) was such that the depth of the raw calcium fluoride melting solution (7) was 6 cm (which is 0.33 time as great as the diameter of the straight barrel portion of the as-grown single crystal) in the inner crucible (5). Moreover, the surface condition of the melting solution (7) accommodated in the inner crucible (5) was observed again through the view port (22). At this time, the solid impurity was not found.

Subsequently, the single crystal pulling bar (13) was moved downward and the lower end face of the seed crystal (11) having a crystal plane of {111} (a single crystal growth surface) was caused to come in contact with the surface of the raw calcium fluoride melting solution (7) to start to grow a single crystal.

The seed crystal (11) was rotated at 6 times/minute, while the outer crucible (4) was also rotated at 2 times/minute in a reverse direction thereto, and the pulling was carried out in this state. During the pulling, the support shaft (2) was continuously moved upward in such a manner that the depth of the melting solution (7) in the inner crucible (5) was maintained to be 6 cm. After the end of the pulling, the temperature was reduced to an ordinary temperature.

Thus, there was obtained 15.1 kg of a calcium fluoride as-grown single crystal in which a straight barrel portion has a diameter of 180 mm and a length of 150 mm (the straight barrel portion has a volume of 3820 $cm^3$ and the whole as-grown single crystal has a volume of 4750 $cm^3$).

Referring to the calcium fluoride as-grown single crystal, the numbers of scattering bodies present in the whole inner part of the straight barrel portion and the whole inner part of the as-grown single crystal were measured. For the result, the number of the scattering bodies present in the whole inner part of the straight barrel portion was 5 and a presence rate thereof was 0.0013/$cm^3$. Moreover, the number of the scattering bodies present in the whole inner part of the as-grown single crystal was 21 and a presence rate thereof was 0.004/$cm^3$.

The as-grown single crystal was sliced to have a thickness of 10 mm over a perpendicular surface in a growing direction and crystallinity thereof was examined by using an X-ray topograph. As a result, it could be confirmed that although a sub-grain boundary was present, a deviation in a plane direction was 0.1 degree or less and a single crystal was obtained.

Comparative Example 1

In the apparatus for pulling a single crystal which was used in the Example 1, the inner crucible (5) was not used but only the outer crucible (4) was used for a crucible. A raw calcium fluoride lump and high purity lead fluoride were put in the same amounts therein. An amount of accommodation of the raw calcium fluoride lump with respect to the crucible (4) was such that the depth of the melting solution was 12.2 cm (a depth which is 0.76 time as great as the diameter of the straight barrel portion of the as-grown single crystal) in the case in which melting is carried out.

Air was evacuated from the inner part of the chamber (1) ($5 \times 10^{-6}$ torr or less) and the heater (8) was conducted to start to heat the material, and the temperature was raised to 250° C. and the temperature was held for 2 hours. Then, the rise in the temperature was started again. When the temperature reached 600° C., a vacuum evacuating line was blocked and high purity argon was supplied into the chamber (1), and an internal pressure was maintained to be 106.4 KPa.

The temperature was held for 40 minutes at 1480° C. at which the material was completely molten, and a heater output was then lowered and the temperature was held at 1440° C. for 120 minutes. At this time, the surface condition of the melting solution (7) accommodated in the inner crucible (5) was observed through the view port (22). Consequently, the float of a solid impurity was confirmed.

Subsequently, the single crystal pulling bar (13) was moved downward and the lower end face (a single crystal growth surface) of the seed crystal (11) having a crystal plane of {111} was caused to come in contact with the surface of the raw calcium fluoride melting solution (7) to start to grow a single crystal. The seed crystal (11) was rotated at 6 times/minute, while the crucible (4) was also rotated at 2 times/minute in a reverse direction thereto, and the pulling was carried out in this state. After the end of the pulling, the temperature was dropped to a normal temperature.

In the pulling of the single crystal, the amount of the raw calcium fluoride melting solution (7) remaining in the crucible (4) at the end of the pulling was such that the depth was 7.6 cm (a depth which is 0.48 time as great as the diameter of the straight barrel portion of the as-grown single crystal).

Thus, there was obtained 15.0 kg of a calcium fluoride as-grown single crystal in which a straight barrel portion has a diameter of 160 mm and a length of 200 mm (the straight barrel portion has a volume of 4020 $cm^3$ and the whole as-grown single crystal has a volume of 4690 $cm^3$).

Referring to the calcium fluoride as-grown single crystal, the numbers of scattering bodies present in the whole inner part of the straight barrel portion and the whole inner part of the as-grown single crystal were measured. For the result, the number of the scattering bodies present in the whole inner part of the straight barrel portion was 72 and a presence rate thereof was 0.018/$cm^3$. Moreover, the number of the scattering bodies present in the whole inner part of the as-grown single crystal was 164 and a presence rate thereof was 0.035/$cm^3$.

The as-grown single crystal was sliced to have a thickness of 10 mm over a perpendicular surface in a growing direction and a crystallinity thereof was examined by using an X-ray topograph. As a result, a portion in which a plane direction was completely different was found partially, and it was confirmed that a partial polycrystallized portion was present.

Example 2

A calcium fluoride single crystal was produced in the same manner as in the Example 1 except that the amount of the raw calcium fluoride lump to be accommodated in the outer crucible (4) and the inner crucible (5) was set to be 50 kg and the amount of the high purity zinc fluoride to be accommodated in the inner crucible (5) was set to be 2.5 g in the Example 1.

Before the start of the pulling, the accommodating depth of the inner crucible (5) with respect to the outer crucible (4) was such that the depth of the raw calcium fluoride melting solution (7) was 12 cm (which is 0.60 time as great as the diameter of the straight barrel portion of the as-grown single crystal) in the inner crucible (5).

Consequently, there was obtained 28 kg of a calcium fluoride as-grown single crystal in which a straight barrel portion has a diameter of 200 mm and a length of 250 mm (the straight barrel portion has a volume of 7850 $cm^3$ and the whole as-grown single crystal has a volume of 8900 $cm^3$).

Referring to the calcium fluoride as-grown single crystal, the numbers of scattering bodies present in the whole inner part of the straight barrel portion and the whole inner part of the as-grown single crystal were measured. For the result, the number of the scattering bodies present in the whole inner part of the straight barrel portion was 13 and a presence rate thereof was 0.0017/$cm^3$. Moreover, the number of the scattering bodies present in the whole inner part of the as-grown single crystal was 42 and a presence rate thereof was 0.0047/cm³.

The as-grown single crystal was sliced to have a thickness of 10 mm over a perpendicular surface in a growing direction and a crystallinity thereof was examined by using an X-ray topograph. As a result, it was confirmed that although a subgrain boundary was present, a deviation in a plane direction was 0.1 degree or less and a single crystal was obtained.

Example 3

A calcium fluoride single crystal was produced in the same manner as in the Example 1 except that the lower end face (the single crystal growth surface) of the seed crystal (11) having a crystal plane of {100} was caused to come in contact with the surface of the raw calcium fluoride melting solution (7) to grow a single crystal in the Example 1.

Consequently, there was obtained 18.9 kg of a calcium fluoride as-grown single crystal in which a straight barrel portion has a diameter of 180 mm and a length of 200 mm (the straight barrel portion has a volume of 5090 cm³ and the whole as-grown single crystal has a volume of 5940 cm³).

Referring to the calcium fluoride as-grown single crystal, the numbers of scattering bodies present in the whole inner part of the straight barrel portion and the whole inner part of the as-grown single crystal were measured. For the result, the number of the scattering bodies present in the whole inner part of the straight barrel portion was 4 and a presence rate thereof was 0.0008/cm³. Moreover, the number of the scattering bodies present in the whole inner part of the as-grown single crystal was 22 and a presence rate thereof was 0.0037/cm³.

The as-grown single crystal was sliced to have a thickness of 10 mm over a perpendicular surface in a growing direction and a crystallinity thereof was examined by using an X-ray topograph. As a result, it was confirmed that although a subgrain boundary was present, a deviation in a plane direction was 0.1 degree or less and a single crystal was obtained.

Example 4

A barium fluoride single crystal was produced by using the same single crystal pulling apparatus as that used in the Example 1.

A material barium fluoride lump subjected to a sufficient purification treatment and moisture removal treatment was put in a total amount of 40 kg into the outer crucible (4) and the inner crucible (5), and furthermore, 6 g of high purity zinc fluoride was put as a scavenger into the inner crucible (5), and they were disposed in the chamber (1).

Then, air was evacuated from the inner part of the chamber (1) (5×10⁻⁶ torr or less) and the heater (8) was conducted to start to heat the material, and the temperature was raised to 250° C. and the temperature was held for 2 hours. Thereafter, the rise in the temperature was started again. When the temperature reached 600° C., a vacuum evacuating line was blocked and high purity argon was supplied into the chamber (1), and an internal pressure was maintained to be 106.4 KPa.

In a state in which the material was completely molten and the material barium fluoride melting solution (7) was accommodated in the outer crucible (4) and the inner crucible (5), the temperature was held at 1380° C. for 40 minutes, and a heater output was then lowered and the temperature was held at 1320° C. for 120 minutes.

The surface condition of the melting solution (7) accommodated in the inner crucible (5) was observed through the view port (22). Consequently, the float of a solid impurity was confirmed. Therefore, the support shaft (2) was moved downward to reduce the accommodating depth of the inner crucible (5) with respect to the outer crucible (4), thereby causing a full amount of the single crystal material melting solution (7) accommodated in the inner crucible (5) to flow into the outer crucible (4). Then, the support shaft (2) was moved upward again to increase the accommodating depth of the inner crucible (5) with respect to the outer crucible (4), thereby supplying, into the inner crucible (5), the material barium fluoride melting solution (7) in the outer crucible (4).

After the operation, the accommodating depth of the inner crucible (5) with respect to the outer crucible (4) was such that the depth of the material barium fluoride melting solution (7) was 8 cm (which is 0.44 time as great as the diameter of the straight barrel portion of the as-grown single crystal) in the inner crucible (5). Moreover, the surface condition of the melting solution (7) accommodated in the inner crucible (5) was observed again through the view port (22). At this time, the solid impurity was not found.

Subsequently, the single crystal pulling bar (9) was moved downward and the lower end face (a single crystal growth surface) of the seed crystal (7) having a crystal plane of {111} was caused to come in contact with the surface of the material barium fluoride melting solution (7) to start to grow a single crystal. The seed crystal (11) was rotated at 6 times/minute, while the outer crucible (4) was also rotated at 2 times/minutes, and the pulling was carried out in this state.

During the pulling, the support shaft (2) was continuously moved upward at a speed of 0.83 mm/Hr in such a manner that the depth of the melting solution (7) in the inner crucible (5) was maintained to be 8 cm. After the end of the pulling, the temperature was reduced to an ordinary temperature.

Thus, there was obtained 18.0 kg of a barium fluoride as-grown single crystal in which a straight barrel portion has a diameter of 180 mm and a length of 120 mm (the straight barrel portion has a volume of 3050 cm³ and the whole as-grown single crystal has a volume of 3730 cm³).

Referring to the barium fluoride as-grown single crystal, the numbers of scattering bodies present in the whole inner part of the straight barrel portion and the whole inner part of the as-grown single crystal were measured. For the result, the number of the scattering bodies present in the whole inner part of the straight barrel portion was 5 and a presence rate thereof was 0.0016/cm³. Moreover, the number of the scattering bodies present in the whole inner part of the as-grown single crystal was 17 and a presence rate thereof was 0.0046/cm³.

The as-grown single crystal was sliced to have a thickness of 10 mm over a perpendicular surface in a growing direction and a crystallinity thereof was examined by using an X-ray topograph. As a result, it was confirmed that although a subgrain boundary was present, a deviation in a plane direction was 0.1 degree or less and a single crystal was obtained.

Example 5

A calcium fluoride single crystal was produced by using a pulling apparatus for producing a single crystal which has the same structure as that in the Example 1 except that the shielding member (21) was attached to the double structured crucible (6) as shown in FIG. 2.

In the double structured crucible (6), the outer crucible (4) had a depth of 30 cm and an inside diameter of 50 cm and the inner crucible (5) had a depth of 150 cm and an inside diameter of 36 cm, and the crucible bottom took a V shape (a shape of a grinding bowl) in which an inclination angle in a downward direction was 30 degrees with respect to a horizontal plane toward a center (an interior angle of 120 degrees).

The plate-shaped shielding member (21) taking a shape of a circular ring having a thickness of 6 mm and a gap of 1.5 mm from the inner wall of the outer crucible was attached to the outer wall of the inner crucible in a position of 2 cm from the upper end.

The inner crucible was provided with nine cylindrical communicating holes (14) having a diameter of 4 mm in total, that is, one communicating hole on a lower end (central part) thereof and eight communicating holes at an equal interval over a circumference in a position placed upward apart from the central part along the bottom wall surface by 25 mm.

The heat insulating wall (9) was a pitch system graphite molded heat insulator and a radiating capability in a vertical direction was 9 W/m$^2$·K. Moreover, the ceiling board provided thereabove was formed of graphite and the radiating capability in the vertical direction was 5000 W/m$^2$·K.

After the moisture in the chamber was sufficiently removed by baking, the position of the outer crucible was lowered and 70 kg of a calcium fluoride material and 7 g of zinc fluoride (scavenger) were set into the outer crucible, and the position of the outer crucible was lifted to a position in which the opening portion of the gap space was closed by the shielding member.

Air was evacuated from the inner part of the chamber. When $5\times10^{-3}$ Pa or less was reached, the heater was conducted to start to heat the material while the evacuation was continuously carried out. A temperature was raised until the temperature of the bottom portion of the crucible reached 250° C. at approximately 50° C./Hr and the temperature was held for 12 hours. A degree of vacuum in the chamber after 24 hours was $1\times10^{-3}$ Pa.

Then, the rise in the temperature was started again at approximately 50° C./Hr. After the temperature of the bottom portion of the crucible reached 1450° C., it was further held for 3 hours. Thereafter, a vacuum evacuation line was blocked to supply high purity argon into the chamber and an internal pressure (an in-furnace atmospheric pressure) was maintained to be 19 kPa. Subsequently, the pulling was ended and neither an air discharge nor a gas introduction was carried out until the temperature was dropped to the vicinity of a room temperature. Moreover, it was confirmed, through the view port (22), that the raw calcium fluoride was not molten at the crucible bottom temperature of 1450° C.

After a pressure release to 19 kPa, a heater output was increased to raise the temperature of the bottom portion of the crucible to be 1600° C. After the temperature was held for 60 minutes, it was confirmed, through the view port (22) provided in the upper part of the chamber, that the material was completely molten. The position of the outer crucible was moved upward in this state to cause a part of the metal fluoride material melting solution to flow into the hollow portion of the inner crucible, thereby bringing a state in which the calcium fluoride material melting solution (7) was accommodated in the outer crucible (4) and the inner crucible (5).

Then, the heater output was reduced to hold the temperature of the bottom portion of the crucible to be 1580° C. for 40 minutes, and then, the heater output was further reduced to hold the temperature to be 1540° C. for 120 minutes.

The surface condition of the melting solution (7) accommodated in the inner crucible (5) was observed through the view port (22). Consequently, the float of a solid impurity was confirmed. Therefore, the support shaft (2) was moved downward to reduce the accommodating depth of the inner crucible (5) with respect to the outer crucible (4), thereby causing a full amount of the single crystal material melting solution (7) accommodated in the inner crucible (5) to flow into the outer crucible (4). Then, the support shaft (2) was moved upward again to increase the accommodating depth of the inner crucible (5) with respect to the outer crucible (4), thereby supplying, into the inner crucible (5), the calcium fluoride material melting solution (7) in the outer crucible (4). This operation was repeated until the solid impurity could not be confirmed on the surface of the melting solution in the inner crucible.

After the operation was ended, the position of the outer crucible (4) with respect to the inner crucible (5) was set in such a manner that the depth of the raw calcium fluoride melting solution (7) in the inner crucible (5) was 10 cm.

Next, the lower end face (the single crystal growth surface) of the seed surface (11) having a crystal plane of {111} was caused to come in contact with the surface of the raw calcium fluoride melting solution (7) to start to grow a single crystal. The seed crystal was rotated at 8 rpm and the pulling was carried out at 4 mm/Hr. After starting the growth, a crystal growth speed was measured by means of a load cell provided on the pulling shaft and was fed back to the heater output, thereby carrying out an automatic control in order to approximate to a preset crystal shape.

For a size of the crystal intended on the above conditions, a single crystal includes a straight barrel portion having a diameter of 250 mm and a length of 150 mm. Moreover, the outer crucible (4) was gradually lifted with the crystal growth in such a manner that the depth of the melting solution (7) in the inner crucible (5) was maintained to be 10 cm. After the end of the pulling, the temperature was dropped to 300° C. at a cooling speed of 15° C./Hr, and the heater was then turned off to drop the temperature to an ordinary temperature.

The pulling of the single crystal was repeated nine times on the above conditions. Consequently, any trouble was not made at all until the single crystal had a target size for four times, and troubles such as a crystal cut or the generation of a solidification at the bottom of a crucible were made for five times.

For twice in the five times that the troubles were made, troubles were made twice or more during one pulling operation (For once, the troubles were made three times). Moreover, the crystal could not be reconnected once so that the pulling had to be stopped before the single crystal had the target size.

A specimen having a thickness of 10 mm in which a surface was polished to have a surface roughness of 0.5 nm or less in RMS was prepared from the calcium fluoride single crystal thus produced (the number is nine including the specimens making troubles during the pulling). By using a VUV transmittance measuring apparatus (produced by JASCO Corporation, KV-201; measured in a nitrogen atmosphere having an oxygen content of 0.2 ppm or less), a transmittance was measured within a range of 120 to 300 nm. As a result, all of the specimens had a light transmittance of 90 to 92% in 193 nm, 87 to 88% in 157 nm, and 83 to 84% in 130 nm.

Reference Example 1

The production of a calcium fluoride single crystal was tried on the same conditions as those in the Example 5 by using the same single crystal pulling apparatus as that in the Example 5 except that the shielding member (21) was not attached to the double structured crucible (6). However, the bottom portion of the crucible was held at 1450° C. for 3 hours under a vacuum evacuation and the inner part of the crystal growth furnace was tried to be observed through the view port. However, a solid matter was stuck in a large amount so that the inner part could not be observed. Therefore, a subsequent operation was stopped and the furnace was opened to observe the inner part. Consequently, the raw calcium fluoride (a solidified melting solution) in the crucible was remarkably decreased. On the other hand, a substance regarded to be a calcium fluoride crystal was stuck in a large amount everywhere in the furnace.

Reference Example 2

A single crystal was pulled by using the same single crystal pulling apparatus as that in the Example 5 except that the shielding member (21) was not attached to the double structured crucible (6). The pulling was carried out on the same conditions as those in the Example 5 except that a holding time at 250° C. in a temperature raising process was set to be a double, that is, 24 hours and a temperature at which high purity argon was supplied into the chamber was set to be 600° C. in order to avoid the volatilization of the raw metal fluoride.

The pulling of the single crystal was repeated six times on the above conditions. Consequently, any trouble was not made only once until the single crystal had a target size, and a crystal cut or the generation of a solidification at the bottom of a crucible was caused five times. For three times in the five times that the troubles were made, furthermore, troubles were made twice or more during one pulling operation (For once, the troubles were made three times). Moreover, the crystal could not be reconnected twice so that the pulling had to be stopped before the single crystal had the target size (once after a second trouble).

In the same manner as in the Example 5, light transmittances of (six) calcium fluoride single crystals thus produced were measured. Consequently, all of the specimens had a transmittance of 90 to 92% in 193 nm and a transmittance of 87 to 88% in 157 nm which are equal to those in the Example 5, and had a transmittance of 26 to 81% in 130 nm.

The invention claimed is:

1. A process for producing a metal fluoride single crystal using an apparatus for pulling a metal fluoride single crystal,
    wherein, in the apparatus, a double structured crucible constituted by an outer crucible and an inner crucible accommodated in the outer crucible is provided in a chamber forming a single crystal growth furnace,
    hollow portions of both the outer crucible and the inner crucible in the double structured crucible partially communicate with each other,
    the double structured crucible can continuously change an accommodating depth of the inner crucible with respect to the outer crucible,
    a single crystal pulling bar having a tip to which a seed crystal is attached so as to be used and suspended to be vertically movable is provided just above the hollow portion of the inner crucible in the chamber, and
    a circular opening portion for upward opening a gap space formed by an internal surface of the outer crucible and an external surface of the inner crucible is provided between an internal surface of a sidewall of the outer crucible and an external surface of a sidewall of the inner crucible;
    the process comprising:
    accommodating a raw metal fluoride melting solution in each of the hollow portions of the outer crucible and the inner crucible, and then, once reducing the accommodating depth of the inner crucible with respect to the outer crucible to cause the melting solution accommodated in the inner crucible to flow toward the outer crucible side;
    thereafter increasing the accommodating depth of the inner crucible with respect to the outer crucible again to feed, into the inner crucible, the melting solution in the outer crucible; and
    carrying out the operation at least once and subsequently starting an operation for pulling a metal fluoride single crystal.

2. The process for producing a metal fluoride single crystal according to claim 1, further comprising:
    moving the single crystal pulling bar downward until the seed crystal attached to the tip of the single crystal pulling bar comes in contact with a surface of the melting solution accommodated in the inner crucible and then pulling the single crystal pulling bar gradually to grow a metal fluoride single crystal;
    increasing the accommodating depth of the inner crucible with respect to the outer crucible in the growth of the metal fluoride single crystal, according to a decrease of the melting solution accommodated in the inner crucible with the growth of the metal fluoride single crystal; and
    supplementing the melting solution accommodated in the outer crucible into the inner crucible in such a manner that an amount of the melting solution in the inner crucible is maintained within a certain range.

3. The process for producing a metal fluoride single crystal according to claim 2, wherein the accommodating depth of the inner crucible with respect to the outer crucible is increased in such a manner that the amount of the melting solution in the inner crucible has a depth of 3 cm or more and is maintained within a range of at least 0.65 time as great as a diameter of a straight barrel portion of the single crystal during the pulling of the metal fluoride single crystal.

4. The process for producing a metal fluoride single crystal according to claim 1, wherein a floating solid impurity mixed in the melting solution accommodated in the inner crucible is discharged to the outer crucible side by the operation, and the solid impurity floats over a surface of the melting solution accommodated in the outer crucible.

5. The process for pulling a metal fluoride single crystal according to claim 1, wherein the inner crucible is provided with a communicating hole for causing hollow portions of both the outer crucible and the inner crucible to communicate with each other, wherein the communicating hole is formed on a lowermost end of the sidewall or a bottom wall when the bottom wall is horizontal, or below a position in which an inside diameter of the bottom wall is equal to or smaller than ¼ of an inside diameter of the inner crucible when the bottom wall takes a downward convex shape.

6. The process for pulling a metal fluoride single crystal according to claim 1, wherein a shielding member for shielding at least a part of a portion between the internal surface of the sidewall of the outer crucible and the external surface of the sidewall of the inner crucible is provided in the opening portion or a position between the internal surface of the sidewall of the outer crucible and the external surface of the sidewall of the inner crucible below the opening portion.

* * * * *